(12) United States Patent  (10) Patent No.: US 7,394,149 B2
Clayton et al.  (45) Date of Patent: Jul. 1, 2008

(54) THIN MULTICHIP FLEX-MODULE

(75) Inventors: James E. Clayton, Raleigh, NC (US); Zakaryae Fathi, Raleigh, NC (US)

(73) Assignee: Microelectronics Assembly Technologies, Inc., Research Triangle Park, NC (US)

( * ) Notice: Subject to any disclaimer, the term of this patent is extended or adjusted under 35 U.S.C. 154(b) by 0 days.

(21) Appl. No.: 11/715,303

(22) Filed: Mar. 7, 2007

(65) Prior Publication Data

US 2007/0212902 A1 Sep. 13, 2007

Related U.S. Application Data

(60) Provisional application No. 60/780,440, filed on Mar. 8, 2006.

(51) Int. Cl.
*H01L 23/02* (2006.01)
(52) U.S. Cl. .......................... 257/686; 439/77
(58) Field of Classification Search ................. 439/190, 439/191, 192, 196, 629–637, 67, 77, 61, 439/62, 541.5; 257/686, 723, 724
See application file for complete search history.

(56) References Cited

U.S. PATENT DOCUMENTS

| | | | |
|---|---|---|---|
| 4,656,605 A | | 4/1987 | Clayton |
| 4,727,513 A | | 2/1988 | Clayton |
| 4,850,892 A | | 7/1989 | Clayton |
| 5,224,023 A | * | 6/1993 | Smith et al. ............... 361/784 |
| 5,661,339 A | * | 8/1997 | Clayton ..................... 257/678 |
| 5,708,297 A | * | 1/1998 | Clayton ..................... 257/723 |
| 5,731,633 A | * | 3/1998 | Clayton ..................... 257/723 |
| 5,751,553 A | * | 5/1998 | Clayton ..................... 361/749 |
| 5,908,333 A | * | 6/1999 | Perino et al. .............. 439/631 |
| 6,025,992 A | * | 2/2000 | Dodge et al. .............. 361/704 |
| 6,049,975 A | * | 4/2000 | Clayton ....................... 29/832 |
| 6,091,145 A | * | 7/2000 | Clayton ..................... 257/724 |
| 6,232,659 B1 | * | 5/2001 | Clayton ..................... 257/724 |
| 6,273,759 B1 | * | 8/2001 | Perino et al. .............. 439/631 |

(Continued)

FOREIGN PATENT DOCUMENTS

JP 3424929 2/1996

OTHER PUBLICATIONS

ANON. Thermal Performance of ArctiCore(tm) FBDIMMs and Conventional FBDIMMs, Staktek Corp. Technology Whitepaper.

*Primary Examiner*—Ross N Gushi
(74) *Attorney, Agent, or Firm*—Robert J. Lauf

(57) ABSTRACT

A low insertion force multichip in-line module comprises: a substantially rigid frame; a flex circuit having a plurality of integrated circuit chips disposed thereon, the flex circuit having contacts at least partially exposed along one edge of the frame; and, a compliant layer disposed between the exposed flex circuit and the rigid frame, whereby controlled deformation of the compliant layer enhances electrical continuity between the contacts and corresponding external electrical pins. Alternatively, a low insertion force multichip in-line module comprises: a substantially rigid frame; a flex circuit having a plurality of integrated circuit chips disposed thereon, the flex circuit having contacts at least partially exposed along one edge of the frame; a socket configured to matably engage the module; and, a compliant layer disposed between the exposed flex circuit and the rigid frame, whereby controlled deformation of the compliant layer enhances electrical continuity between the contacts and corresponding external electrical pins.

8 Claims, 22 Drawing Sheets

U.S. PATENT DOCUMENTS

| | | |
|---|---|---|
| 6,353,538 B1 * 3/2002 | Ali et al. | 361/728 |
| 6,362,966 B1 * 3/2002 | Ali et al. | 361/728 |
| 6,472,744 B1 * 10/2002 | Sato et al. | 257/723 |
| 6,665,190 B2 12/2003 | Clayton | |
| 6,670,697 B2 * 12/2003 | Hasegawa | 257/670 |
| 6,674,644 B2 * 1/2004 | Schulz | 361/728 |
| 6,762,942 B1 7/2004 | Smith | 361/749 |
| 6,840,808 B2 * 1/2005 | Ruckerbauer et al. | 439/631 |
| 6,896,534 B2 * 5/2005 | Ruckerbauer | 439/259 |
| RE39,153 E * 7/2006 | Perino et al. | 439/631 |
| 7,122,889 B2 * 10/2006 | Belgacem | 257/696 |
| 7,215,551 B2 * 5/2007 | Wang et al. | 361/707 |
| 7,289,327 B2 * 10/2007 | Goodwin et al. | 361/701 |
| 2002/0142660 A1 * 10/2002 | Abe | 439/631 |
| 2004/0048518 A1 * 3/2004 | Ruckerbauer et al. | 439/631 |
| 2006/0048385 A1 * 3/2006 | Cady et al. | 29/860 |
| 2006/0049500 A1 * 3/2006 | Goodwin | 257/686 |
| 2006/0049502 A1 * 3/2006 | Goodwin et al. | 257/686 |
| 2006/0049512 A1 * 3/2006 | Goodwin | 257/707 |
| 2006/0049513 A1 * 3/2006 | Goodwin | 257/712 |
| 2006/0050488 A1 * 3/2006 | Goodwin | 361/749 |
| 2006/0050489 A1 * 3/2006 | Wehrly et al. | 361/749 |
| 2006/0050492 A1 * 3/2006 | Goodwin et al. | 361/767 |
| 2006/0050496 A1 * 3/2006 | Goodwin | 361/803 |
| 2006/0050497 A1 * 3/2006 | Goodwin | 361/803 |
| 2006/0050498 A1 * 3/2006 | Cady et al. | 361/803 |
| 2006/0050592 A1 3/2006 | Cady et al. | |
| 2006/0053345 A1 * 3/2006 | Goodwin | 714/42 |
| 2006/0055024 A1 3/2006 | Wehrly | |
| 2006/0091529 A1 * 5/2006 | Wehrly et al. | 257/706 |
| 2006/0125067 A1 * 6/2006 | Wehrly et al. | 257/679 |
| 2006/0129888 A1 * 6/2006 | Szewerenko et al. | 714/30 |
| 2006/0198238 A1 * 9/2006 | Partridge et al. | 365/233.5 |
| 2006/0203442 A1 * 9/2006 | Goodwin | 361/684 |
| 2006/0250780 A1 * 11/2006 | Goodwin | 361/767 |
| 2006/0261449 A1 * 11/2006 | Rapport et al. | 257/666 |
| 2007/0111606 A1 * 5/2007 | Goodwin | 439/633 |
| 2007/0115017 A1 * 5/2007 | Goodwin et al. | 324/763 |
| 2007/0126124 A1 * 6/2007 | Rapport et al. | 257/777 |
| 2007/0126125 A1 * 6/2007 | Rapport et al. | 257/777 |
| 2007/0176286 A1 * 8/2007 | Wehrly, Jr. | 257/723 |
| 2007/0201208 A1 * 8/2007 | Goodwin et al. | 361/701 |
| 2007/0211426 A1 * 9/2007 | Clayton et al. | 361/689 |
| 2007/0211711 A1 * 9/2007 | Clayton | 370/360 |
| 2007/0212902 A1 * 9/2007 | Clayton et al. | 439/66 |
| 2007/0212906 A1 * 9/2007 | Clayton et al. | 439/77 |
| 2007/0212919 A1 * 9/2007 | Clayton et al. | 439/326 |
| 2007/0212920 A1 * 9/2007 | Clayton et al. | 439/326 |
| 2007/0258217 A1 * 11/2007 | Roper et al. | 361/709 |
| 2008/0030966 A1 * 2/2008 | Goodwin | 361/749 |
| 2008/0030972 A1 * 2/2008 | Goodwin | 361/803 |

* cited by examiner

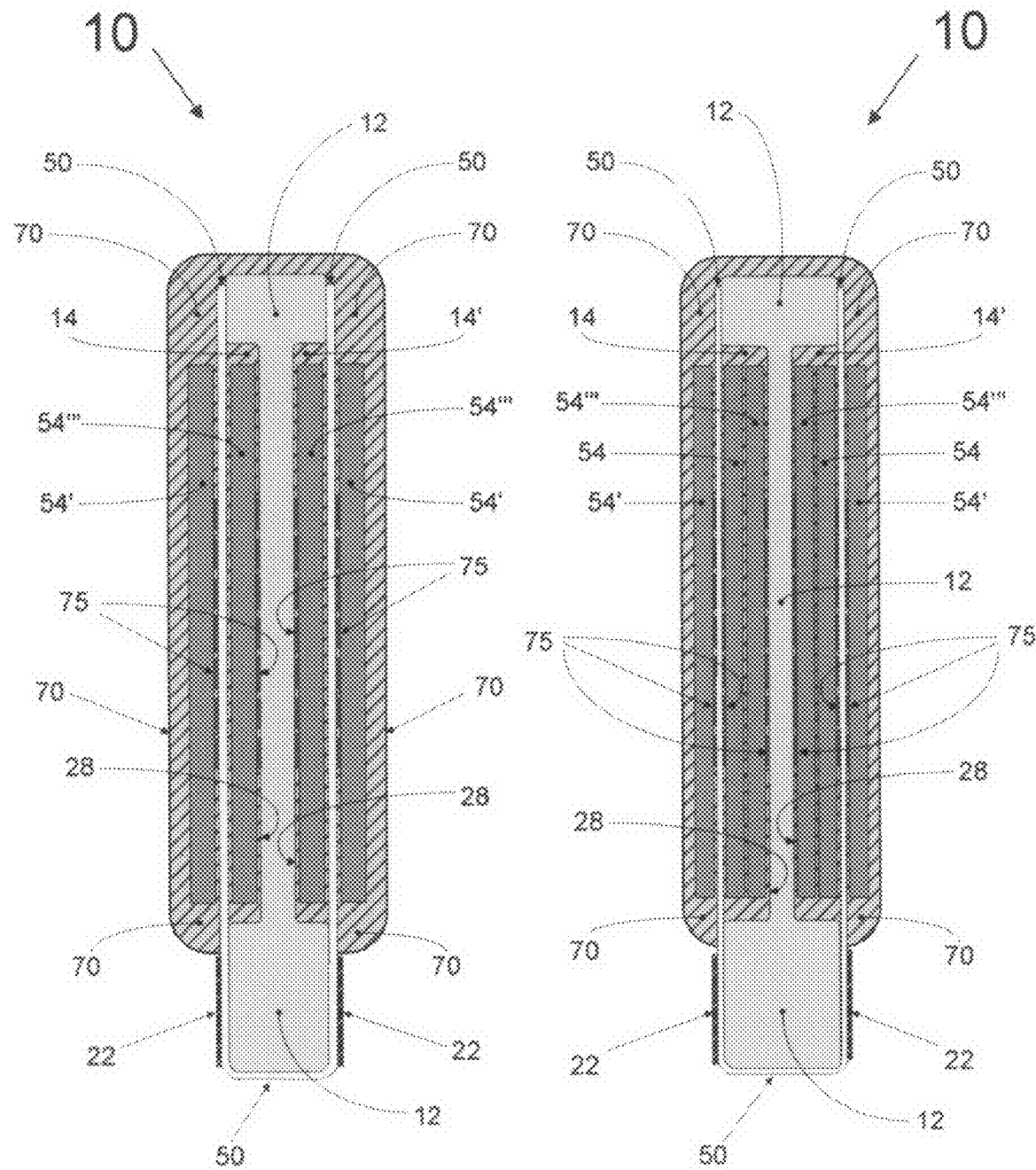

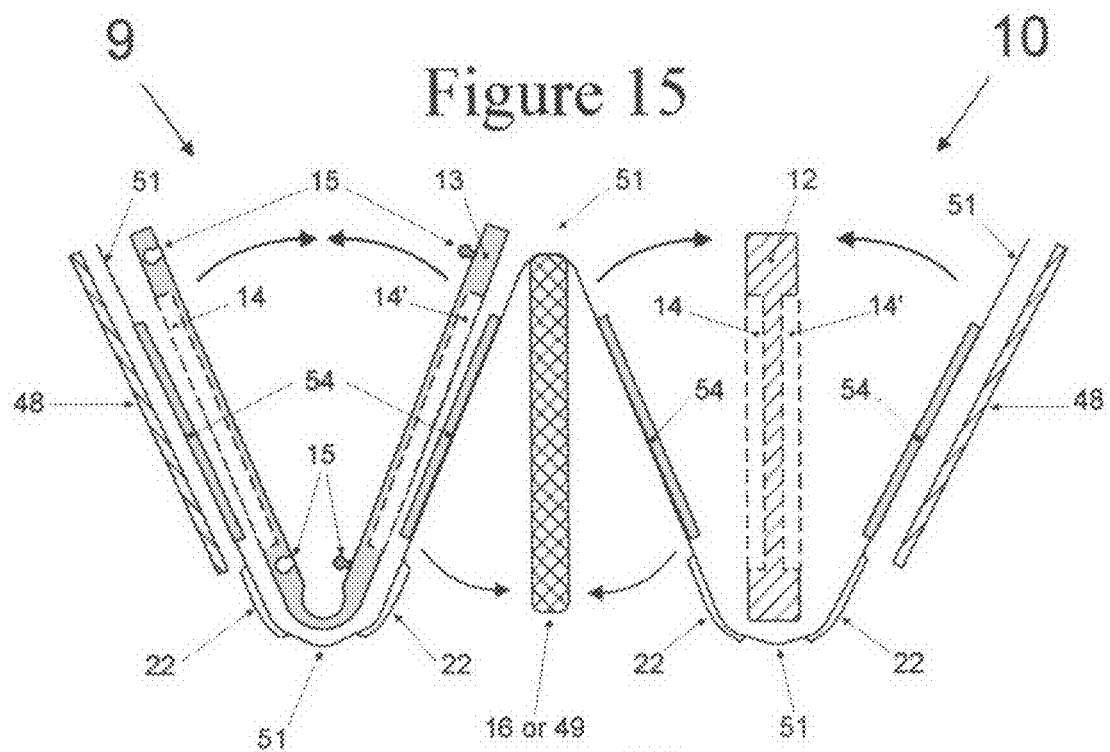
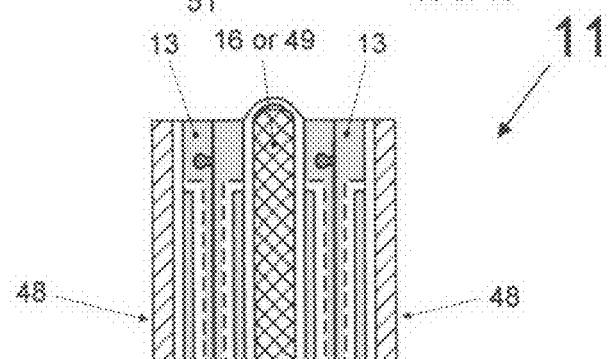
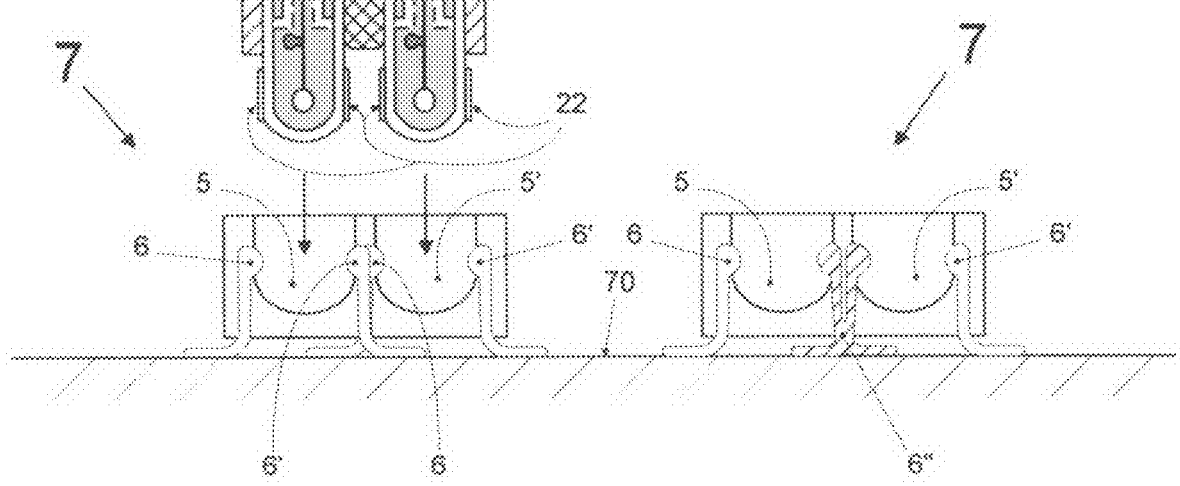

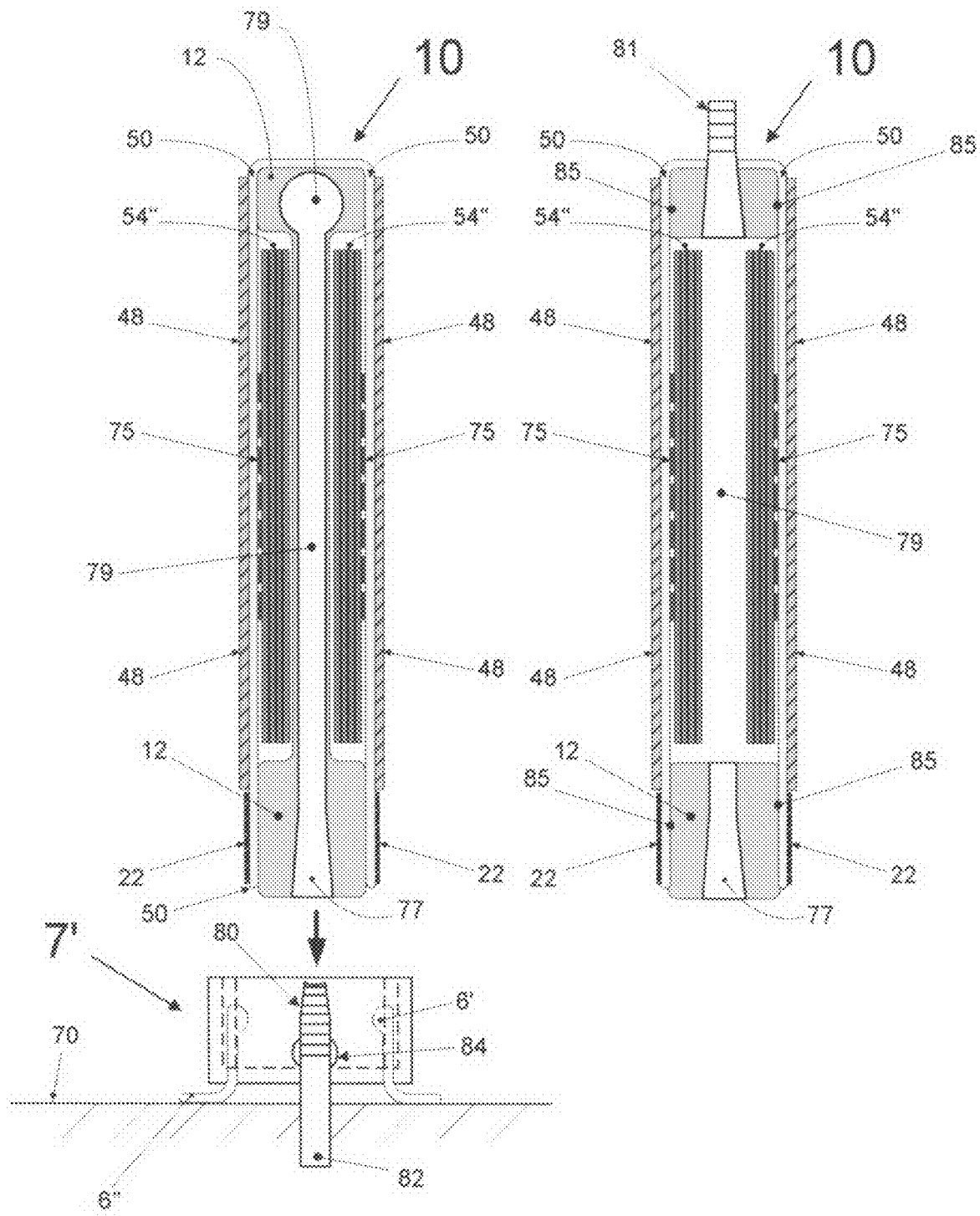

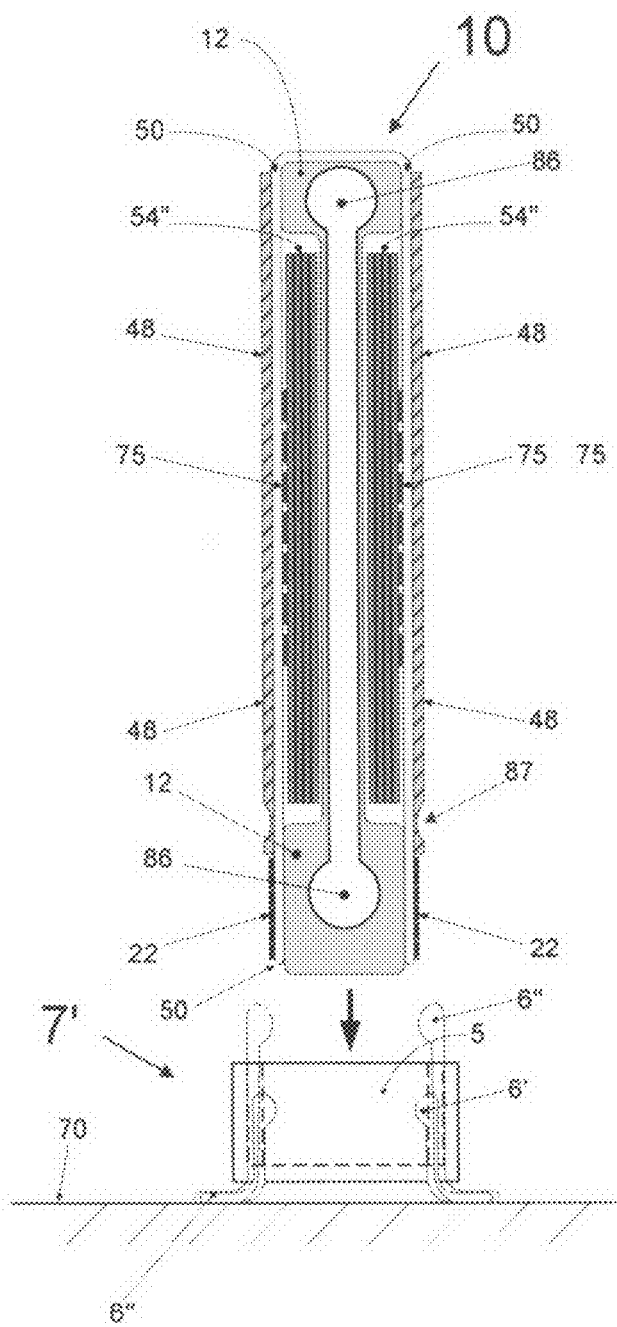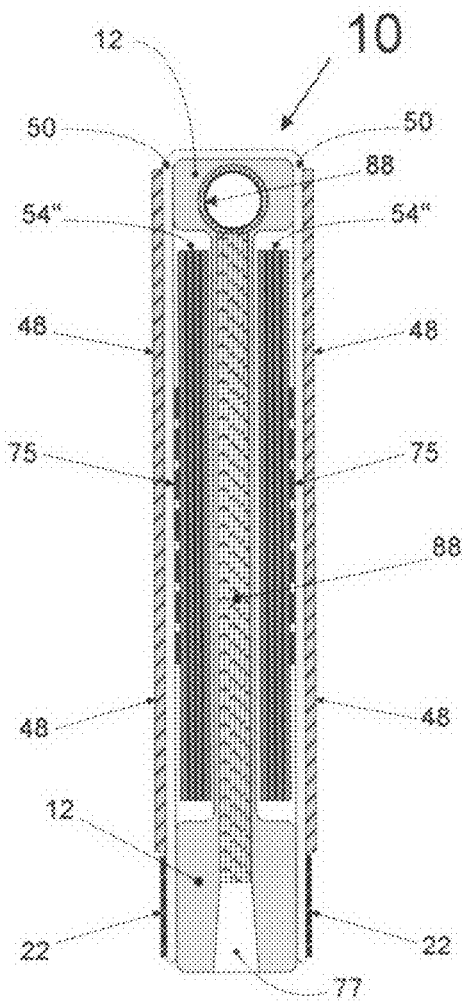
Figure 22
Figure 23

THIN MULTICHIP FLEX-MODULE

CROSS-REFERENCE TO RELATED APPLICATION

This application claims the benefit of Provisional Patent Application No. 60/780,440 by the present inventors, filed on Mar. 8, 2006, the entire disclosure of which is incorporated herein by reference.

BACKGROUND OF THE INVENTION

1. Field of the Invention

The present invention relates generally to means for packaging microelectronic devices. More particularly, the invention relates to improved, SIMM and DIMM type memory modules.

2. Description of Related Art

Multichip module (MCM) assembly is currently an enabling technology for improving system performance in high-end workstation and super computers. By interconnecting multiple bare dice on a single substrate, packaging density is increased and chip-to-chip communication distance is consequently shortened, enabling higher operating speeds. Small, lightweight consumer products such as notebook or handheld computers and telephony products are expected to benefit from the improved miniaturization that MCM technology accomplishes. Unfortunately, this technology is currently too expensive for most of these applications.

A principal reason for the expense associated with multichip modules is that the technology is constrained to low volume, custom applications which cannot attain sufficient market volumes to help drive manufacturing costs down. Part of this problem is exacerbated by a current shortage of reliable, high-volume sources for the large variety of "known good die" required by many MCM applications. "Known good die" are semiconductor IC chips that are fully tested and screened to the same level of reliability as individually packaged parts, and are a fundamental necessity for attaining high MCM assembly yields with minimum repair. There has been recent progress in solving some of the handling issues with respect to bare die testing for both single die and dice still in wafer form, so this problem appears to be resolvable. However, identifying and implementing a high-volume, industry standard MCM application is still proving elusive.

One potential mass market is represented by industry standard Single Inline Memory Modules (SIMM) and Dual Inline Memory Modules (DIMM). These products have annual volumes reaching millions of units. Memory modules typically consist of identical IC device types, eliminating the need for stocking a large variety of "known good die". Memory modules, however, are noted for being a highly competitive, low-margin product. Because memory modules are assembled on small area, printed circuit boards, using highly automated processes, they have low associated material and assembly costs. Hence, the standard memory module business is widely thought to be too cost-driven to be considered a good candidate for MCM technology. However, high-end computing platforms, such as blade servers, tower servers and graphic accelerator cards are anticipated to require higher performance memory modules operating above 800 MHz which would benefit from improved module designs.

Some patents relating to memory modules include the following: U.S. Pat. No. 4,656,605, "Single In-Line Memory Module;" U.S. Pat. No. 4,727,513, "Single In-Line Memory Module;" and U.S. Pat. No. 4,850,892, "Connecting Apparatus for Electrically Connecting Memory Modules to a Printed Circuit Board." Additional patents in this area include U.S. Pat. Nos. 5,661,339; 5,708,297; 5,731,633; 5,751,553; 6,049,975; 6,091,145; 6,232,659; 6,665,190; and Japanese Patent 3424929. None of the foregoing discloses means for cooling the interior of the modules.

OBJECTS AND ADVANTAGES

Objects of the present invention include providing an improved memory module design that uses bare die or chip-scale packaged (CSP) memory chips; providing a method by which memory modules can be produced in higher volumes than modules built on PCB panels using surface mount soldering; providing a memory module that is cheaper to manufacture than modules built on PCB panels using surface mount soldering; providing a memory module that can be actively cooled; providing a memory module having higher component and interconnect density; and, providing an improved method for manufacturing memory modules that are backward-compatible with industry standard components.

SUMMARY OF THE INVENTION

According to one aspect of the invention, a low insertion force multichip in-line module comprises:

a substantially rigid frame;

a flex circuit having a plurality of integrated circuit chips disposed thereon, the flex circuit having contacts at least partially exposed along one edge of the frame; and, a compliant layer disposed between the exposed flex circuit and the rigid frame, whereby controlled deformation of the compliant layer enhances electrical continuity between the contacts and corresponding external electrical pins.

According to another aspect of the invention, a low insertion force multichip in-line module comprises:

a substantially rigid frame;

a flex circuit having a plurality of integrated circuit chips disposed thereon, the flex circuit having contacts at least partially exposed along one edge of the frame;

a socket configured to matably engage the module; and, a compliant layer disposed between the exposed flex circuit and the rigid frame, whereby controlled deformation of the compliant layer enhances electrical continuity between the contacts and corresponding external electrical pins.

BRIEF DESCRIPTION OF THE DRAWINGS

FIG. 6 is similar to FIG. 3, but illustrates an embodiment with some of the IC's mounted to an interconnect circuit forming part of the frame to electrically bridge IC's on both sides of the center fold of the flex, to minimize time delays and enhance performance.

FIG. 7 illustrates an embodiment with a combination of features found in both FIG. 3 and FIG. 6. A total of six ICs are shown in cross-section; two mounted to the internal, electrically functional frame and four mounted on both surfaces of the flex circuit sections.

FIG. 15 is a cross-sectional view of yet another embodiment, in which two modules are joined by a continuous strip of flex circuit film. The arrows indicate the direction the modules are being folded, accordion style, to form a double-joined module. Two differing frame choices are represented in this Figure. The frame shown on the left half is a cross section view of a foldable frame, similar to that of FIG. 10, which includes molded features for enabling the frame to be snapped together. The frame on the right half is similar to that shown in FIG. 2. A spacer element or battery is positioned at the center.

FIG. 16 is a cross sectional view of a double-joined module, similar to FIG. 15, being inserted into a double-rowed socket designed to mate with this module.

FIG. 20 is a cross section view of the flex module from FIG. 5 with a modified frame member that is intended to provide a means for transporting a cooling gas or liquid through an interior cavity to remove internal heat from the enclosed semiconductor devices. A mating socket is also illustrated showing a means for connecting both inlet and outlet ports to a bottom portion of the module frame.

FIG. 21 is a cross section view of an alternative cavity for receiving coolant material within the interior portion of the flex module, formed by a hermetic seal of the enclosing flex circuit and coverplates.

FIG. 22 is a cross section view of another means for cooling the modules interior using a frame that incorporates an internal heat pipe to conduct the heat away from the contained semiconductor devices using a contained vapor phase change medium. This figure also includes a means for providing either a ground or voltage reference to the module coverplates through elevated pins contained in the mating socket.

FIG. 23 is a cross-sectional view of another means for cooling the module interior that incorporates a thin layer of carbon nano-tubes (CNT) that reduce the friction of fluid flow, thereby increasing the rate of fluid transport and efficiency of thermal conduction and removal.

DETAILED DESCRIPTION OF THE INVENTION

Figure 1:
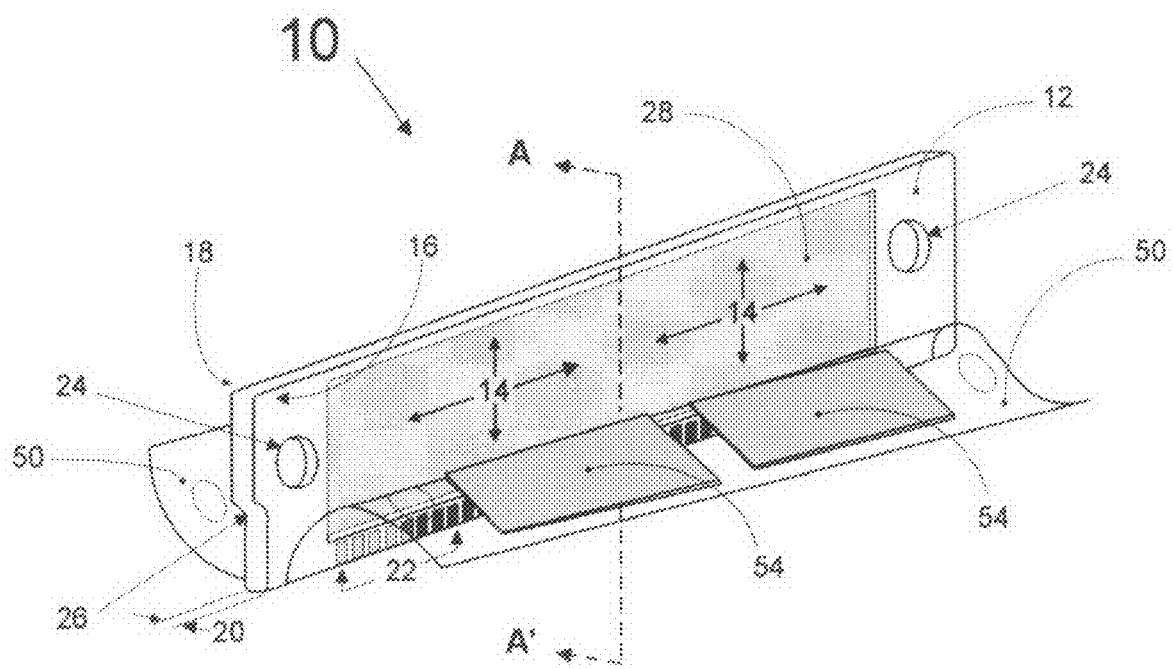
FIG. 1 is a perspective drawing of a partially assembled first embodiment of the present invention. Two integrated circuit (IC) devices are shown mounted on a flex circuit substrate, which is in the process of being wrapped around the bottom edge of a frame that is molded into the shape of a SIMM circuit board.

The following embodiments introduce new construction concepts and assembly methods directed at providing lower-cost, higher-density, packaging solutions for next generation electronic module products. The module embodiments disclosed herein may be broadly classified as "Multichip Modules" in that the semiconductor devices illustrated are preferably in a "bare-die" or "chip" form. It will be understood, however, that in some instances packaged die may be used instead of bare die, depending on design objectives.

The electronics industry presently recognizes three main types or divisions of multichip modules based on the type of interconnecting substrate upon which the bare-die or chips are assembled: MCM-D (deposited thin film), MCM-C (ceramic), and MCM-L (laminate). MCM type-L refers to conventional epoxy/glass, printed circuit board laminate substrates and comes closest, of the three categories, for classifying the present invention. Epoxy/glass PCBs, however, are generally too thick, rigid and brittle for the purposes of this invention (although current research, directed at reducing PCB thickness, suggests that this may change in the future) and do not accurately characterize the thin flexible substrates preferred for these embodiments. Therefore a fourth classification, MCM-F, based on thin, flexible substrates is proposed as a more descriptive classification for modules of the present invention.

In addition to various module embodiments and assembly methods disclosed herein, new socket/connector designs are also described. These sockets are designed to complement the various module embodiments and extend their usefulness at the system level.

In a packaged semiconductor IC such as microprocessors die or memory die, heat escapes predominantly from the solder balls area than through the package itself. This holds true regardless of the package configuration, whether single, dual or quad die (these consist of stacked chips). In the innovative module hereby introduced the chips are mounted in the best thermal conductive path for optimal heat exhaust. The chips are mounted on a thin, flex circuit (for better thermal transfer), the flex circuit is laminated to a heat dissipating surface, the flex has provisions for optimal heat transport by using appropriately placed thermal vias) between the flex and the heat sink. The heat sink is of sufficient dimensions (thickness and surface area) to accommodate the required heat flux. The heat sink is in contact with a cool air (or other fluid) stream for best heat removal. All chips maintain the best thermal path for maximum heat exhaust. In some embodiments the chips may be cooled in two opposite paths.

A thermal via is defined as a thermal conduit extending through the flex circuit. These thermal vias may or may not have electrical functionality. The thermal vias can be built into the flex circuit by various fabrication methods including laser drilling and back filling with a high thermal conductivity material or through the well known combination of photo-definable processes along with metal electroplating. The density of thermal via in the Flex-circuit is another design consideration by which more or less heat can be exhausted. The higher the density of thermal vias the better, provided signal integrity in the flex circuit is not compromised.

In contrast, prior art modules using PCB cannot achieve optimal thermal exhaust because they are placed on a thermally insulating substrate.

The innovative memory module configuration disclosed in the current invention yields a combination of enhancements in each of the following areas: better thermal cooling (best heat removal), better thickness (very thin module compared to alternatives), lower height for Low Profile configurations and full rework capability. The reason rework capability is important is that defective chips resulting from faulty assembly steps during manufacturing can be corrected for with ease which enhances production yields.

In the best mode, the chips are mounted on Flex and the flex surface opposite the solder balls of the chip is attached using a thermally conductive material to a heat sink that has heat exchanging properties and is preferably placed in a stream of cooling fluid with minimal impediment.

The various embodiments of the FlexModule 10 of the present invention can be understood by referring initially to FIG. 1, which is a perspective view of the major components. The module of FIG. 1 comprises a module frame 12 (hereinafter referred to as either a "molded frame" or "module frame" or simply "frame"), thin flexible circuit 50 and integrated circuit (IC) devices 54. The molded frame 12 comprises a first and second major parallel plane or surface, noted as reference numerals 16 and 18, respectively, which are separated by a specified edge thickness 20. The frame shown in FIG. 1 is intended to represent a SIMM module, in that a corner notch 26 and two end holes 24 are fashioned into the frame, enabling it to mate with existing SIMM type sockets. Other embodiments may substitute a frame designed to match the shape of standard DIMM or other module form factors.

The invention makes use of structural members with various characteristics and functions. The non-foldable frame 12 in this invention assumes various functions and roles. Some of these functions are mechanical and some of these functions are electrical. The non-foldable frame can contain depressions, recessed cavity(s) or window(s) 14 extending below the first major surface 16 of the non-foldable frame 12, stretching over a substantial portion of the length and width of the frame. The non-foldable frame 12 has provisions for contact pads, holes, windows, internal cavities, floor, and recesses and stepped ledges. The non-foldable frame can act as a spacer to prevent chips from crushing each other's. The foldable frame 13 can be used in combination with the non-foldable frame 12 or a spacer element 16 without any recesses and could be assembled to the surface(s) of frame 12 or spacer 16 for mechanical protection and heat sinking functions to the internally mounted chips.

Electrical functions are also intended for the non-foldable frame in some cases. The internally positioned non-foldable frame 12 used in combination with the foldable frame 13 has internal portions or windows inside the module that can electrically bridge chips on opposing folds of the module. This is done when the internal non-foldable frame 12 has internal portions or windows inside the module that can electrically bridge the flex circuitry upon which the chips are mounted across opposing folds inside the module. The internal non-foldable frame inside the module can be metallic with or without embossments and/or cutout windows. The internal frame inside the module can be a moldable thermoplastic. The internal non-foldable frame inside the module can be metallic or a moldable thermoplastic with flex circuit portions or PCB portions.

As with the non-foldable frame 12, the foldable frame 13 in this invention also plays several functions and roles. Some of these functions are mechanical and some of these functions are electrical. The foldable frame assumes a flat configuration when it is fully open. In this fully open and flat position the flex can be laminated onto the frame. Once the lamination process is done, the frame acts as a carrier for chip assembly onto the flex. As such the open frame goes through SMT solder reflow followed by underfill and cure, if deemed necessary (e.g., for flip chip). After assembly of the chips, the open and flat subassembly may be tested and repaired, if necessary. The frame is now ready for folding. The folding takes place in steps.

The outermost sections of the foldable frame 13 with mounted chips 54" are folded first through a 180 degree arc towards the center in either an upward or downward direction followed by a center-folding step with both pre-folded sections rotating towards one another through a 90 degree arc to meet at the center in either an upward or downward direction. The folding of the frame is enabled by special provisions and these are obtained through several methods. One method is to thin down the metal areas along the folding area 108. Another method is to machine creases to enable easier folding along the folding area 108. The preferred method is to have several straight metallic sections that are articulated using pivot mechanisms 112 machined or formed in the sections. In this case, when the pivots 112 are engaged, the foldable frame can be closed in sections with minimal force. Furthermore, the foldable frame can be opened with minimal force.

Some surfaces in the foldable frame can be used as ground planes. The outer surfaces of the foldable frame can be used as an EMI shield.

The foldable frame has specially designed mechanisms or features that when the frame is folded the features are juxtaposed to close proximity to form useful shape and mechanisms that assume various functions. One mechanism formed through folding specially designed features in the foldable frame is the connector area 109 around which the flexible circuit is folded. This is how the module can have its connector that gets inserted into standard sockets. The module in the current invention has a foldable frame that is adapted for insertion into a SIMM or DIMM sockets. One mechanism formed through folding specially designed features in the foldable frame is a latch mechanism or snap latch 124 that once engaged through the fold operation the snap latch keeps the module in tight closed configuration. The foldable frame contains mechanism features that act as spacers when the frame is fully closed. The spacers are designed to prevent chips from crushing each other and would limit mechanical pressure applied to the chips 54". The spacer elements may exist as part of the foldable frame or be independent structural members that get introduced separately. Another mechanism formed subsequent to the folding operation is internal fluid channels. In the case, features exist on the foldable frame and when the frame is folded these features form air channels or cavities 79 such as illustrated in FIG. 20. Another mechanism formed subsequent to folding the frame, is a fluid delivery conduit or orifice 77. These features exist on the foldable frame and these features form the inlet 77 and outlet 81 ports for fluid delivery when the module is folded. Another useful mechanism is the existence of a male perimeter protrusion that mates with a female perimeter recess in such a way that when the module is folded an internal chamber is sealed (not shown). Alternatively, a perimeter gasket can be adhered to the perimeter of said foldable frame in such a way to maintain a sealed internal volume inside the module in its fully folded position (not shown). Alternatively, a perimeter adhesive can be adhered to the perimeter of said frame in such a way to maintain a sealed internal volume inside the module in its fully folded position (not shown).

The foldable frame has a thermal function consisting of spreading the thermal energy emanating from the chips and then transferring the thermal energy through the foldable frame surfaces into a stream of air or cooling fluid. A series of heat exchanging surfaces 105 and 107 may be formed once the module is folded. These heat-exchanging surfaces can form a hollow volume or hollow channel 120. The hollow channel enables higher performance heat exchange and would be used in applications with high heat dissipation. The center of the hollow channel 120 is aligned with the BB' center fold line defined in this invention. The dimensions and the morphology of the hollow channel inside the module depend on the foldable frame.

In this inventive multi-fold module, the foldable frame is folded in such a way that four heat-exchanging surfaces are formed. Two heat-exchanging surfaces are on the outside of the fully folded module are referred to as right and left sections-E. The walls of the hollow channel 120 present two heat-exchanging surfaces and are referred to right and left sections I. The four heat exchanging surfaces are preferably located opposite the semiconductor chip's contact pads 74 or solder balls 106 (shortest thermal path configuration), such that a majority of the chip's heat is conducted through the flex circuit and through the thermal vias and into the heat-exchanging surfaces. The heat-exchanging surfaces are in the path of maximum airflow and the thermal energy is carried away from the module. The flex circuit and the foldable frame are designed to allow for folds and bends in such a manner that the assembled chips assume specific placement when the frame is fully folded, all the chips are in the shortest thermal path configuration. The foldable module is designed to assume an overall thickness and height with specific dimensions. The configuration of the folded module has provisions for maximum heat transfer. The module is folded in such a manner as to maintain a maximum heat transfer path (that is to say a short path between the solder balls of the chips and the heat sink with minimal thermal impedances).

When the module is fully closed, a hollow channel 120 is formed in the interior of the module and presents two heat-spreading surfaces 105 from which the heat can be exhausted and through which an air stream can pass. For air to circulate efficiently through the parallel walls 105 of the hollow channel 120 there should be no obstructions in the air path and the gap between the parallel walls forming the hollow section inside the module has to be wide enough to enable air circulation. If appropriate dimensions are not designed in, air could simply circumvent the hollow channel.

When 105 and 107 are closed they define an internal volume in either the left or the right section of the module. This internal volume can be cooled through the use of a cooling fluid that can be circulated through an access port 77 congruent with one of the embodiments of the present invention. These internal volumes can be cooled using the methods described in this invention that consist of fluid inlets and outlets described in FIGS. 20 and 21.

The current inventive module (or Multi-fold Flex Module) has maximum heat exhaust capability in that the chips can be cooled using air-cooling on the external surfaces of each module section as well as circulating a fluid coolant in the internal volume defined within each section. Each chip in the multi-fold module can exhaust heat from two sides. Every chip is made to maintain a heat-exchanging surface with a minimal path between heat generation area and the heat exchanger. These attributes provides for maximum cooling efficiency for semiconductor chips assembled in the inventive multi-fold module.

The foldable frame has three operational positions open, partially open and fully closed. If the module is in the socket, the open and partially open positions the foldable module allows for probing into the electrical functionality of the module by having electrical probes contacting pads or electrical circuitry and for evaluating signal integrity. The fully open position allows provisions for rework by known methods in the state of the art. The rework is not done while the module is in the socket.

Figures 2, 3:
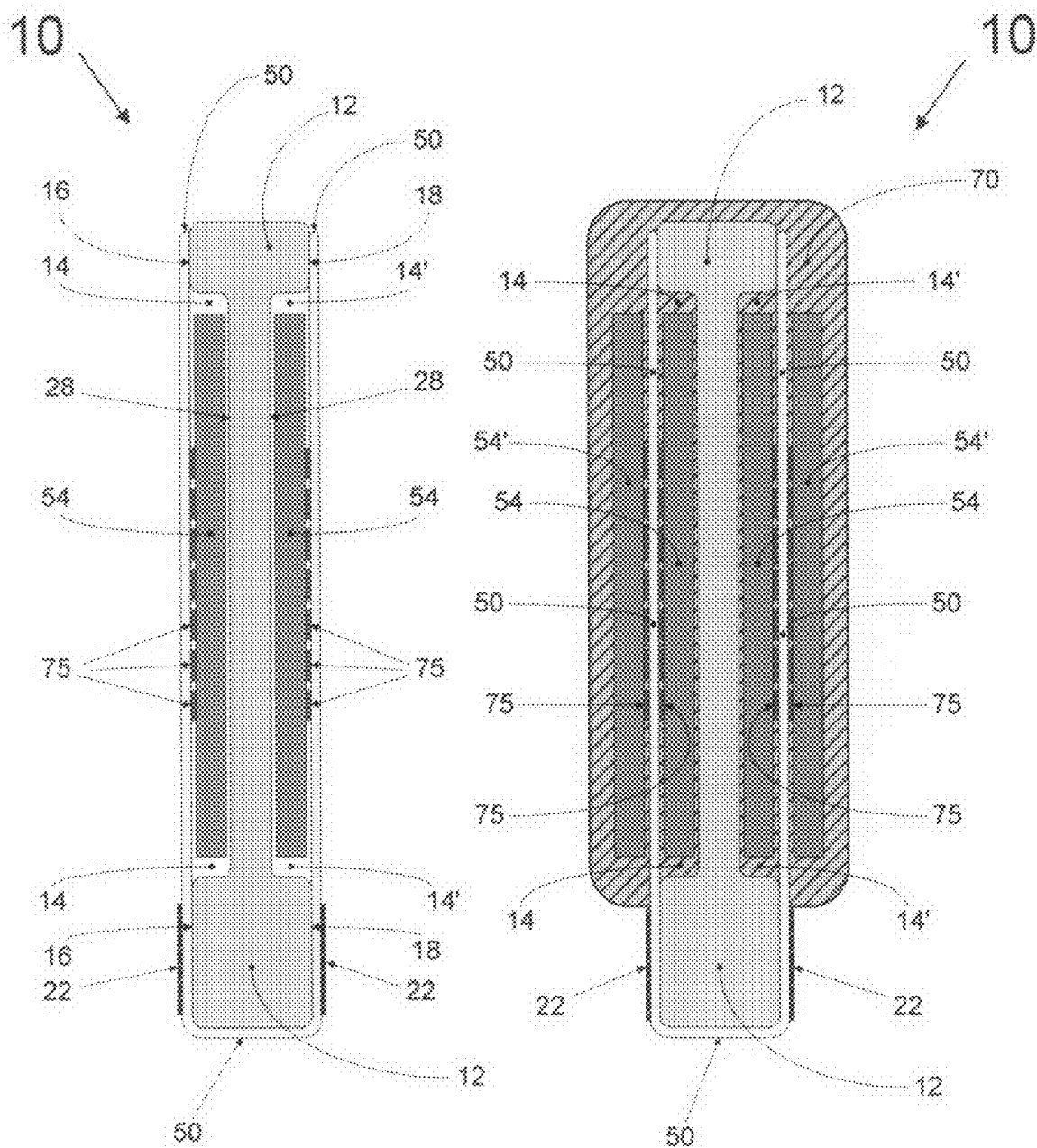
FIG. 2 is a vertical cross-section taken from FIG. 1 after it has been assembled. It illustrates how integrated circuits are nested into cavities formed on both sides of the molded frame.
FIG. 3 is a vertical cross-section of a second embodiment of the present invention. It illustrates how integrated circuits can be mounted on interior and exterior surfaces of the flex circuit, to enable four interconnect levels of IC devices in a single module. A total of four ICs are shown, two on each side of the molded frame. An encapsulant is also illustrated surrounding the ICs.

In order to insure that various embodiments of this invention are compatible with existing SIMM and DIMM connectors, the general thickness of the modules described herein, as measured across the contacts arrayed along the bottom edge(s) 20 of the module and end sections, is preferably 0.040 or 0.050 inch, standard thickness presently established for SIMM and DIMM circuit boards. With exception of multifold modules depicted herein and those that include molded protective overcoats 70 (as shown in FIG. 3 for example), the nominal thickness of the various embodiments of the present invention (measured within the section of the module containing devices 54), is also preferably 0.050 inch. Other embodiments of the present invention, described below, which include either molded protective overcoat 70 and/or coverplate(s) 48, are preferably 0.100 inch thick or less. As a general rule, the various module embodiments described herein are considerably thinner and lighter in weight than existing SIMM & DIMM type modules, yet are backward compatible with connectors developed for the earlier modules.

In the embodiment shown in FIG. 1, a depression, recessed cavity or window 14 extends below the first major surface 16 of the internal frame 12, and stretches over a substantial portion of the length and width of the frame. The internal frame 12 was defined and called in previous inventions "frame", "module frame", or "molded frame". This internal frame, as the name indicates, has provisions for contact pads, holes, windows, internal cavities, floor, recesses and stepped ledges. Metallic coverplates 48, as previously defined, could be assembled to the surface(s) of frame 12 for mechanical protection and heatsinking functions to the internally mounted chips (refer to the previous patents for full definition and explanation). In the preferred embodiment of the previous inventions, the semiconductor chips were mounted on a flexible circuit, which in turn was wrapped around internal frame 12, followed by the attachment of monolithic metallic pieces (coverplate 48) mounted on the outside of the module. Furthermore, provisions for nesting coverplates 48 inside frame 12 were described. In this case the coverplates were internal to the module for heat dissipation purposes. The cavity provides an area into which IC devices 54 are enclosed and protected when flex circuit 50 is assembled onto the frame. IC devices 54 are, therefore, preferably located on the interior surface(s) of flex circuit 50 such that devices 54 lie underneath the flex circuit after it is wrapped around frame 12. This assembly design enables devices 54 of module 10 to be positioned quite close together and as near as possible to the midpoint of the module's thickness. It differs substantially from existing module design practices, which place the devices on the external surfaces of conventional printed circuit boards (PCB) that are manufactured in a standard thickness. Since the PCB is imposed between the devices in this later example, the total module thickness is the combined thickness of the circuit board and individual components mounted on either side of the PCB.

Since many modules require more devices than can be fitted on a single side, a second cavity 14' may also be formed into the second major surface 18, as shown in FIG. 2 and subsequent figures. This enables chip devices 54 to be positioned on both sides of frame 12. Cavity 14 (and/or 14') generally extends below surface 16 (and/or 18) to a floor 28 at a depth equal to or greater than the thickness of IC devices 54. Alternatively, the cavity may extend entirely through edge thickness 20, thereby eliminating floor 28. In other embodiments (not shown), there may be no cavity(s) at all. In this case, devices 54 would not be enclosed within any recessed cavity formed within the frame 12, but would be positioned on the external surface(s) of flex circuit 50. A protective covering would be used in this example to protect devices 54. In yet another embodiment (not shown) separate cavities for individual devices 54 may be formed in frame 12, creating separate walled cavities for the devices and improving the frame's rigidity.

Frame 12 may typically be fashioned from an injection-molded thermoplastic or thermoset material, which may be transparent, translucent or opaque. Other materials that can be molded, pressed, or machined to the proper shape, are also acceptable. Examples include, but are not limited to, polycarbonate plastic, liquid crystal polymer plastics, Ryton™, ceramic, metal, glass, etc. In some embodiments, where IC devices 54 are electrically and mechanically attached directly to frame 12, as illustrated in FIGS. 6 and 7, frame 12 may be fashioned from conventional printed circuit board (PCB) materials. In other embodiments, frame 12 may include heat conductive filler materials or an internal heat pipe to improve the internal thermal dissipation characteristics of the module.

Flex circuit 50 is preferably fashioned from a thin, flexible, insulative film such as polyester, polyethylene terephthalate (PET), polyimide (Kapton™), Goretex™, or other films well known within the flex circuit industry. Conceivably, even thin epoxy-glass printed circuit boards (PCB) may be used for the practice of this invention, assuming the plies are of sufficient elasticity to enable the circuit to be reliably folded into the preferred shape. The flex or "flexible" circuit 50 may be fabricated as either a single-sided circuit, double-sided circuit, or a lamination of two or more layers of films (i.e. multi-layered circuit). Examples of "flexible" circuits 50 are manufactured by Sheldahl (Northfield, Minn.); Poly-Flex Circuits, Inc. (Cranston, R.I.); CTS Corporation (Elkhart, Ind.); Nelco International Corporation (Tempe, Ariz.); Gould Electronics, Inc.; and others.

Flex circuit 50 of FIG. 1 is shown only partially assembled onto frame 12. When folded and attached in place, the flex circuit extends from the top edge and sides of first surface 16, wraps around the bottom edge of frame 12, and continues up the back side or second surface 18 of frame 12. In other words, flex circuit 50 is preferably of sufficient length, to extend from the top edge of the first plane 16 of frame 12, to the top edge of the second plane 18, thereby almost completely enclosing both planes 16 and 18 of frame 12. This is the preferred configuration for flex circuit 50 and is the configuration shown in most modules illustrated. However, other embodiments (not shown) of the present invention may only require the flex circuit to cover one surface of frame 12.

Flex circuit 50 is typically attached to frame 12 by means of a pressure sensitive adhesive (PSA) film (not shown) applied to either the frame or flex circuit prior to assembly. Alternatively, frame 12 may be molded directly onto flex circuit 50 or adhere thereto by means of a variety of bonding agents placed on either the frame or flex circuit.

Attached to flex circuit 50 are IC devices 54 and other surface mount components (not shown) such as chip capacitors, resistors, and inductors. These ICs may be of any variety of semiconductor digital, analog, or mixed-signal devices, but are typically memory chips such as DRAM, SRAM, Flash RAM and others intended for specific applications. Only two such devices are represented in FIG. 1, though in most applications more devices may be required on front or back sides of flex circuit 50.

In FIG. 1 and all following figures, the semiconductor devices illustrated comprise "bare" silicon dice (i.e. the chips are not pre-encapsulated into separate plastic packages). This is the preferred form factor for IC devices used in this invention. The "bare" IC chips are also preferably "Known Good Die" (KGD), meaning that the devices have been verified to be functional and reliable prior to assembly on the flex circuit. This is typically accomplished by screening the dice through a pre-stressing process which subjects the parts to rigorous electrical testing and functional operation while the devices are being temperature cycled.

Devices 54 are attached to the flex circuit using a variety of "Direct Chip Attach" (DCA), "Flip-chip" or "Chip On Board" (COB) techniques. The preferred DCA process makes use of an Anisotropic Conductive Adhesive placed between matching pad grid arrays (PGA) on the semiconductor dice and flex circuit. An example of this is shown as a perspective view in FIG. 17, where the anisotropic adhesive film 58 is illustrated as a thin layer of material situated between device 54 and a PGA site on flex circuit 50. Anisotropic conductive adhesive is formulated to function as an electrical conductor across the thin bond line formed when the material properly joins the IC device to the interconnect (flex) circuit. But, it exhibits an electrically isolative property in the plane perpendicular to the bond line thickness. Anisotropic conductive adhesives are familiar in the art and are manufactured by companies such as 3M (Minneapolis, Minn.), UNIAX Corp. (Bloomfield Hills, Mich.) and ZYMET Inc. (E. Hanover, N.J.). Other acceptable DCA or flip chip assembly technologies include conductive polymer inks, manufactured by companies such as Epoxy Technology, Inc. (Billerica, Mass.) and Alpha Metals (Jersey City, N.J.), as well as solder bumped reflow and conductive PSA tapes.

In addition to using "bare" IC chips, the semiconductor devices can be pre-encapsulated or packaged in "Chip Scale" form. This is a minimum area packaging technique, which approaches the same size as the sectioned dice itself, yet provides a degree of physical robustness to the dice for improved handling and reliability. "Chip Scale" packaged devices may be attached to the flex circuit by conventional surface mount soldering processes. Chip scale packaged devices are in the process of being developed and manufactured by numerous industry suppliers including: Tessera (San Jose, Calif.); Micro SMT; IBM; Motorola; Mitsubishi; Matsushita; Toshiba; and others.

Arrayed along the folded centerline of flex circuit 50, shown in FIG. 1, are numerous contact pads 22. These provided a means of electrical connection and communication between the module's IC devices 54 and a variety of existing SIMM and DIMM connector sockets that are typically mounted on the motherboard. Contact pads 22 of module 10 are preferably positioned on the external surface of flex circuit 50 along the bottom edge of the first 16 and second 18 major surfaces of frame 12. As a point of reference in discussing examples where the flex circuit is attached to both sides of frame 12, it should be noted that corresponding to first and second surfaces of frame 12 are first and second, interior and exterior, surfaces of flex circuit 50. In FIG. 2, for example, it can be seen that contact pads 22 are disposed on first and second exterior surfaces of flex circuit 50 adjacent to the bottom edge of frame 12, and that devices 54 are located on both first and second interior surfaces of flex circuit 50.

Electrical communication between devices 54 and pads 22 of flex circuit 50 is provided through electrically conductive interconnect traces 61 (refer to FIG. 8) that are fabricated on top and bottom surfaces and internal laminate layers of the flex circuit. Interconnect traces common to flex circuit technology included vacuum deposited thin copper films, photo-etched or plated copper films, screen printed silver-filled conductive inks and other materials well known within the PCB industry.

An advantage for the present invention is found in the incorporation of contact pads 22 as an integral part of thin flex circuit 50. In prior work, contact pads 22 were fashioned as an element placed on frame 12 which were subsequently electrically coupled to flex circuit 50. This required two separate interconnect levels within the module. First, an electrical coupling between IC devices 54 and flex circuit 50. And, second, between flex circuit 50 and pads 22 on frame 12. A simpler and more reliable configuration results in the present invention, in that the need for a second electrical coupling level is eliminated. By incorporating contact pads 22 into the exterior surface of the flex circuit and properly positioning the pads along the bottom edge when the thin flex circuit is wrapped around the edge of frame 12, no additional process steps are required to provide electrical interconnect within the module itself (excepting FIGS. 6 and 7 as discussed below). In addition to reducing assembly process steps, fabrication costs of the molded frame are also reduced, since no processing steps are required for adding the contact pads. The molded frame of this invention then, functions primarily as a thin rigid spacer for the IC devices, and as an adapter for enabling the flex circuit to be mated to a connector socket.

FIG. 2 is a cross sectional view taken along axis A-A' of the module depicted in FIG. 1. Recessed below first surface 16 and second surface 18 of frame 12, are cavities 14 and 14' respectively. Flex circuit 50, with attached semiconductor devices 54, is wrapped around the bottom edge of frame 12, and aligned with cavities 14 and 14', such that devices 54 are enclosed within an area defined by the floors 28 and walls of cavities 14 and 14' and flex circuit 50. Although a narrow space appears evident between devices 54 and floor 28, in the illustration of FIG. 2, in actual practice this gap may or may not exist. For example, if a thermally conductive adhesive or elastomeric material is placed on floor 28 as a means for thermally coupling or cushioning devices 54 or if frame 12 is molded directly onto flex circuit 50, then no gap would be expected to be present.

Interposed between devices 54 and flex circuit 50 are pad grid array (PGA) contacts 75. Contacts 75, of FIG. 2, represent discrete pairs of matching contacts present on both IC devices 54 and flex circuit 50, which have been joined by one of the DCA or Flip-chip dice mounting means previously mentioned. An example of matching pairs of contacts ready for joining was previously shown in FIG. 17. Another example can also be seen in FIG. 10. Here, contact pads 74 on devices 54 and pads 76 on the bottom (interior) surface of flex circuit 50, are arrayed in a general grid fashion (PGA) and aligned to one another. The specific arrangement and placement of pads 74 and 76 would, of course, depend on the types of devices 54. For sake of clarity, pads 74 and 76, which are aligned and joined together, are referenced in FIG. 2 and elsewhere as only a single pad 75 when shown in cross section.

Another embodiment illustrated in FIG. 3, is similar to FIG. 2, but includes additional devices 54' on the first and second exterior surfaces of flex circuit 50. In this instance, flex circuit 50 is sandwiched between devices 54 and 54'. A molded protective overcoat 70 is also shown surrounding and encasing the upper portion of Flexmodule 10. This material may consist of thermoplastic or thermoset materials well known within the semiconductor and molding industry, and may be either molded in place, glob-topped, sprayed, or pre-molded as a separate piece and later placed on the module.

Examples of protective overcoat materials are manufactured by Plaskon Electronic Materials (Philadelphia, Pa.) and Parlex Corporation (Methuen, Mass.).

In yet another embodiment of the invention (not shown), cavities 14 and 14' and devices 54, are omitted. In this example, flex circuit 50 has only devices 54' mounted on first and second exterior surfaces, which are protected by protective overcoat 70.

Figure 4:
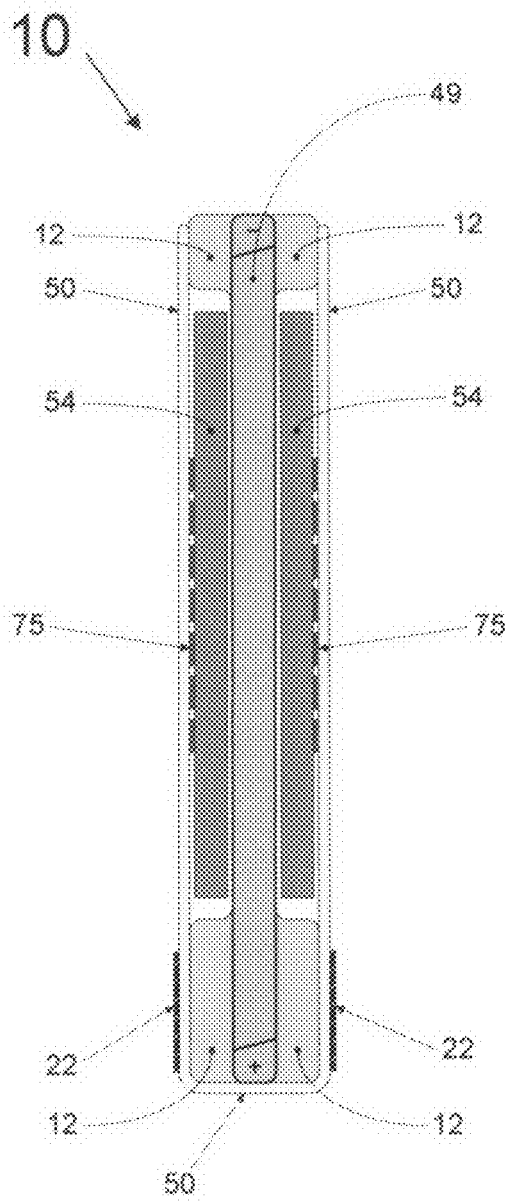
FIG. 4 is similar to FIG. 2, but illustrates a thin, plate-like, battery integrated along the centerline of the molded frame to provide power to the IC devices when the module is removed from its socket.

Referring now to FIG. 4, another embodiment is illustrated, similar to FIG. 2, which shows a thin, plate-like battery 49 incorporated as part of the interior portion of molded frame 12. Incorporation of a battery device with the frame enables a power source for data retention in memory and other semiconductor devices, should main power be inadvertently interrupted at the motherboard and when the module is physically removed from the motherboard socket. Electrical connection of the battery terminals would be accomplished through metal interfaces within the module frame to the flex circuit or directly in contact with metal pads of the flex circuit.

Figure 5:
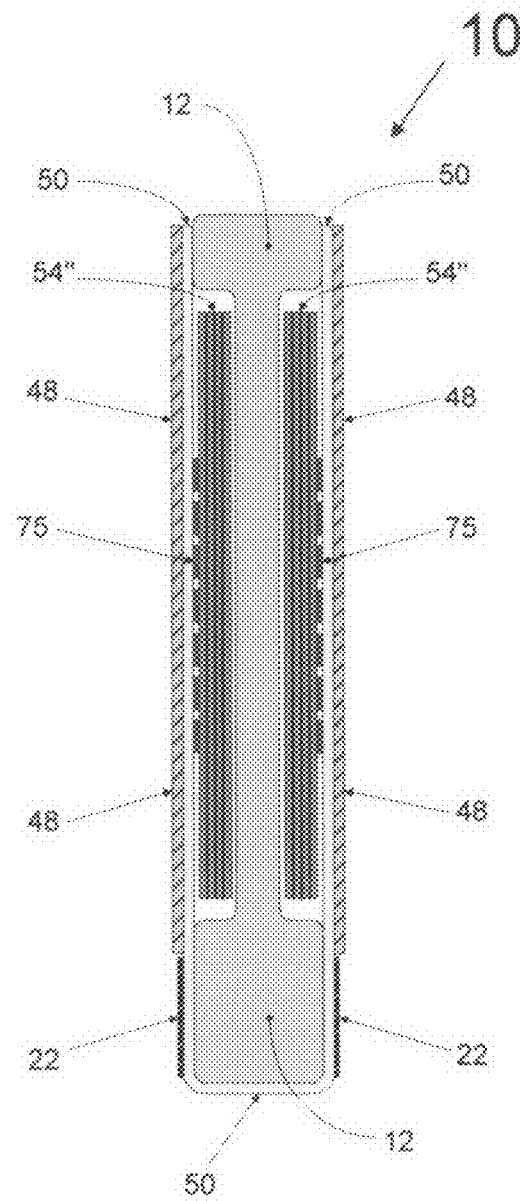
FIG. 5 is also similar to FIG. 2, but illustrates 3-D assemblages of stacked IC's positioned into both cavities of the molded frame. Two thin metal plates enclose the module on either side.

FIG. 5 shows another embodiment, similar to FIG. 2, in which devices 54 are replaced with 3-D stacked devices 54". Stacked devices 54", similar to that illustrated in FIG. 5, are available from Ervine Sensors and from IBM (Burlington, Vt.). Also illustrated in FIG. 5 are two thin cover plates 48 attached to the outer surfaces of flex circuit 50. Plates 48 are preferably approximately 0.010 inch thick and provided both a means for spreading and dissipating heat from the contained devices and for providing a rigid, protective covering for the flex circuit and semiconductor devices. In another embodiment (not shown), in which flex circuit 50 is placed on only one plane (plane 16 for instance) of a frame 12, containing a cavity 14 which extends completely through thickness 20, cover plate 48 may be attached directly to the other unused plane (plane 18 in this example) to provide a removable cover for providing access to devices 54 enclosed within the frame.

Turning now to FIG. 6, an embodiment is illustrated which differs from previous examples, in that devices 54''' positioned within cavities 14 an 14' are connected electrically and mechanically to the floors 28 of frame 12. In this embodiment, frame 12 is fashioned with electrical conductive traces as an integral part of the frame which interconnect devices 54''' and are in turn electrically connected with flex circuit 50. For example, frame 12 of FIG. 6 may consist of a conventional laminated printed circuit board (PCB) with cavities 14 and 14' formed in the outer laminate layer(s) through either a machining or lamination process. By incorporating conductive traces as an integral part of frame 12, an additional level of device mounting can be incorporated into Flexmodule 10. A molded protective overcoat 70, similar to that shown in FIG. 3, is also illustrated in FIG. 6.

An example of an embodiment incorporating three levels of device mounting is shown in FIG. 7. FIG. 7 is essentially a combination of features found in FIGS. 3 and 6. In this embodiment, devices 54''' are mounted electrically and mechanically to floors 28, forming the first level. Additional devices 54 and 54' are attached to first and second interior and exterior surfaces of flex circuit 50, forming the second and third levels respectively. A total of six devices are shown in the cross sectional view of FIG. 7, three on each side of frame 12. Yet another embodiment (not shown) can be realized by replacing single devices mounted to floors 28 of FIG. 7, with multiple stacked devices 54" similar to those shown in FIG. 5. FIG. 7 also includes a molded protective overcoat 70 referred to earlier.

Figure 8:
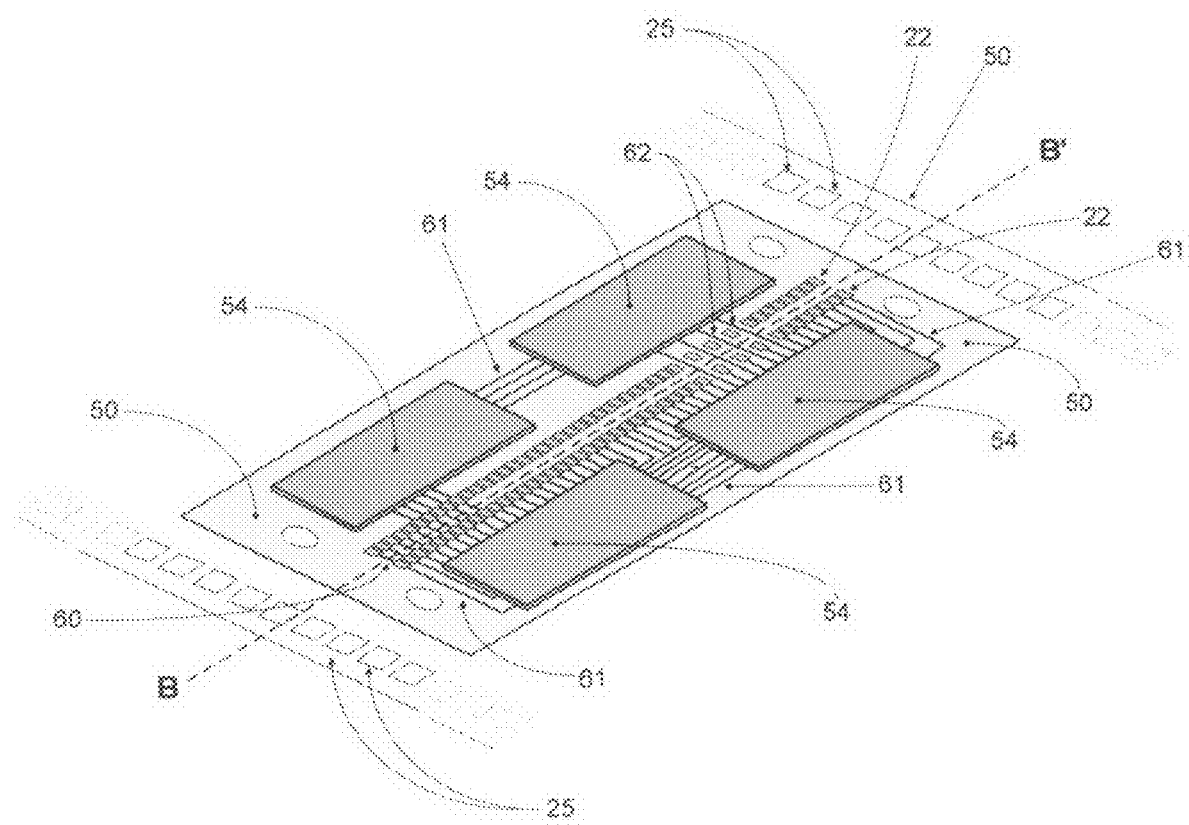
FIG. 8 is a perspective illustration of a strip of flex circuit film with four mounted ICs. The flex circuit film strip has sprocket holes along both edges to enable automated handling of the film in a reel-to-reel fashion.

Turning now to FIG. 8, this drawing illustrates how devices 54 are assembled onto flex circuit 50 in a continuous reel-to-reel or strip fashion. FIG. 8 shows four devices 54 interconnected through conductive traces 61 on a section of flex circuit 50 that is continuous in length. Bracket holes 25 along the edges of the film enable the strip to be conveyed through automated processing equipment, such as that manufactured by Phillips, for the assembly of semiconductor devices and passive components onto the surface of the flex circuit. In this manner, devices 54 on flex circuit 50 are also able to be electrically tested in circuit, repaired and replaced if necessary, and integrated with frame 12. Transport of the flex circuit strip through the processing equipment is facilitated by the bracket holes along the edges, similar to the way in which camera film is wound through a camera, only on a larger scale. Although FIG. 8 illustrates only a single circuit section for simplicity, it will be understood that multiple circuits would be laid out end-to-end on the continuous strip of flex film, and that additional devices may also be mounted on the opposite side during the assembly process.

FIG. 8 details how conductive traces 61 interconnect devices 54 to each other and from one side of the flex circuit to the other side. In the example illustrated, the flex circuit is generally symmetrical and can be considered to consist of two sides defined with respect to a centerline B-B' passing between the two adjacent rows of contacts. In order to provide a path for electrical signals to pass from one side of flex circuit 50 to the other side, across centerline B-B', electrical conductive traces can be routed on either the interior or exterior surfaces of the flex circuit (electrical connection from interior to exterior surfaces or between internal laminate layers is accomplished using well known via technology). For example, to establish electrical continuity across the exterior surface, short electrical jumpers 60 can pass from pad-to-pad across B-B', as shown in FIG. 8, or pass between adjacent pairs of contacts across B-B', as shown at 62. Alternatively, the conductive traces can be routed directly across the interior surface of flex circuit 50. Since contacts 22 are generally located on only the first and second exterior surfaces of the flex circuit (the surfaces intended to mate with the module socket), the interior surface is free of obstructions for routing connecting traces. Possible exceptions would be if the interior surface requires a ground plane or if an interior set of contacts are needed for enabling electrical connections to be made to frame 12, as would be required for FIGS. 4, 6 and 7. In this instance, contact pads present on frame 12 would be aligned with contacts present on the interior surface of the flex circuit and electrically joined with either solder, conductive ink, anisotropic conductive adhesive, or simply pressed or pinched together by the socket pins.

Figure 9:
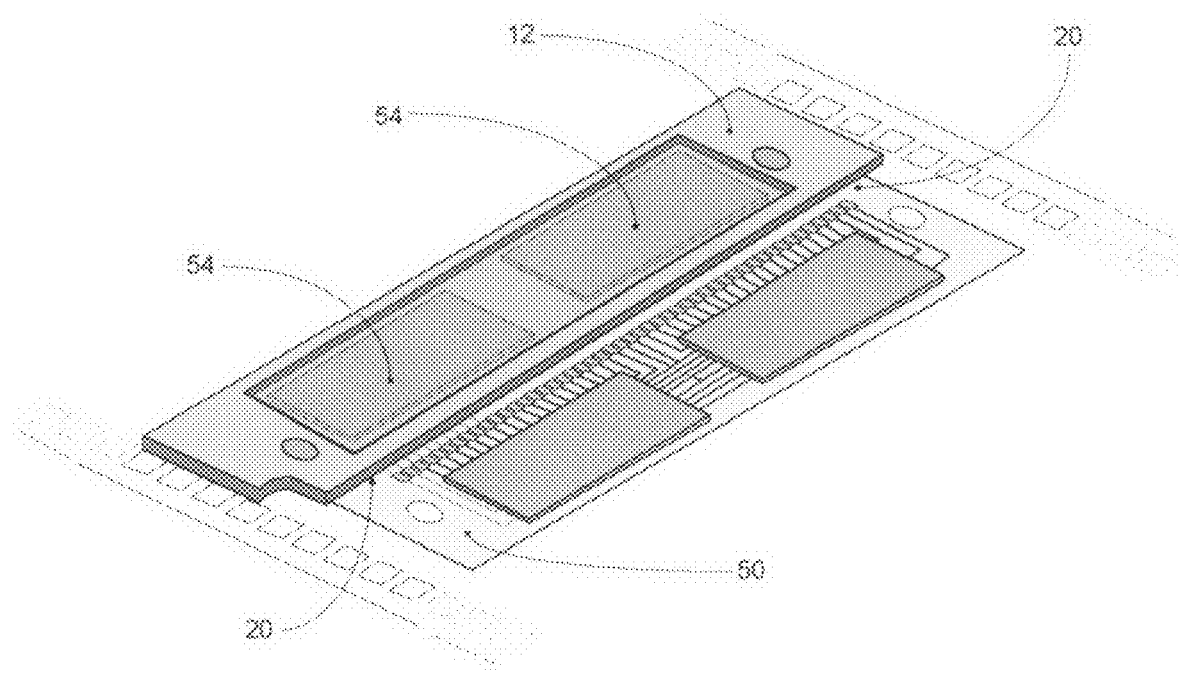
FIG. 9 is similar to FIG. 8, and illustrates how the electrically functional frame can be molded or inserted in place on the flex circuit while the circuit is still in strip form.

Alternative methods may be employed for affixing flex circuit 50 to frame 12 during the assembly process. FIG. 9 illustrates how frame 12 can be placed onto the flex circuit 50 while the circuit is still in strip form. In this example, frame 12 is premolded and adheres to flex circuit 50 by means of either a heat activated or pressure sensitive adhesive pre-applied to either the frame itself or the flex circuit. In another embodiment, frame 12 is molded directly onto the flex circuit. To complete the module assembly, the remaining half of the flex circuit would be wrapped around the edge 20 of the frame 12 and attached to the remaining surface of the frame.

Figure 10:
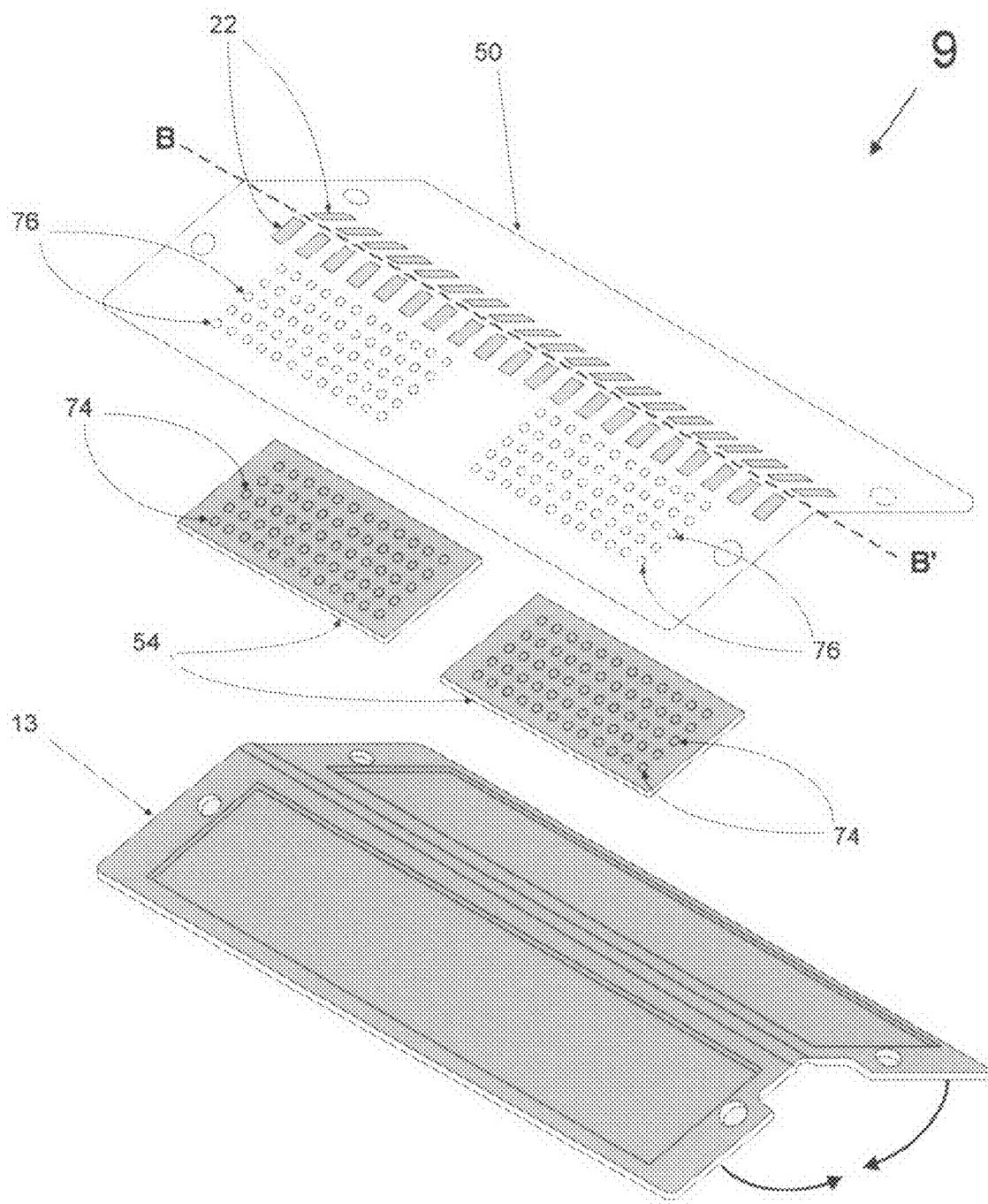
FIG. 10 is an exploded view of an embodiment of the present invention in which a simple foldable frame, with one center of folding axis, is mated to a flex circuit.

Yet another embodiment, referred to as a Flexmodule, is shown at 9 in FIG. 10. This exploded view illustrates two devices 54 positioned between flex circuit 50 and a premolded, foldable frame 13. As noted earlier, a grid array of pads 74 can be seen on the two chip devices and a matching array of pads 76 are located on the underside of flex circuit 50. For sake of simplicity, the interconnecting traces normally visible on both the chips and flex circuit are not shown. Frame 13 is premolded from a flexible material that enables the frame to be folded in half after the flex circuit is attached in place. In this manner, the flex circuit can be applied across both halves of the frame simultaneously, as a relatively flat sheet. This embodiment simplifies the assembly process by eliminating any need for wrapping the flex circuit around the frame. First devices 54 are connected to flex circuit 50, then flex circuit 50 is attached to frame 13, and finally both frame and flex circuit are folded at the same time in the direction of the arrows to produce the finished module. The folded frame 13 is then held together by a variety of means, such as: sandwiching a pressure sensitive adhesive film between the two halves, ultrasonic or thermal welding or staking the halves together, or molding press fitting features into the surface of the frame to enable the halves to snap and lock together. Other methods may also be employed.

Figure 11:
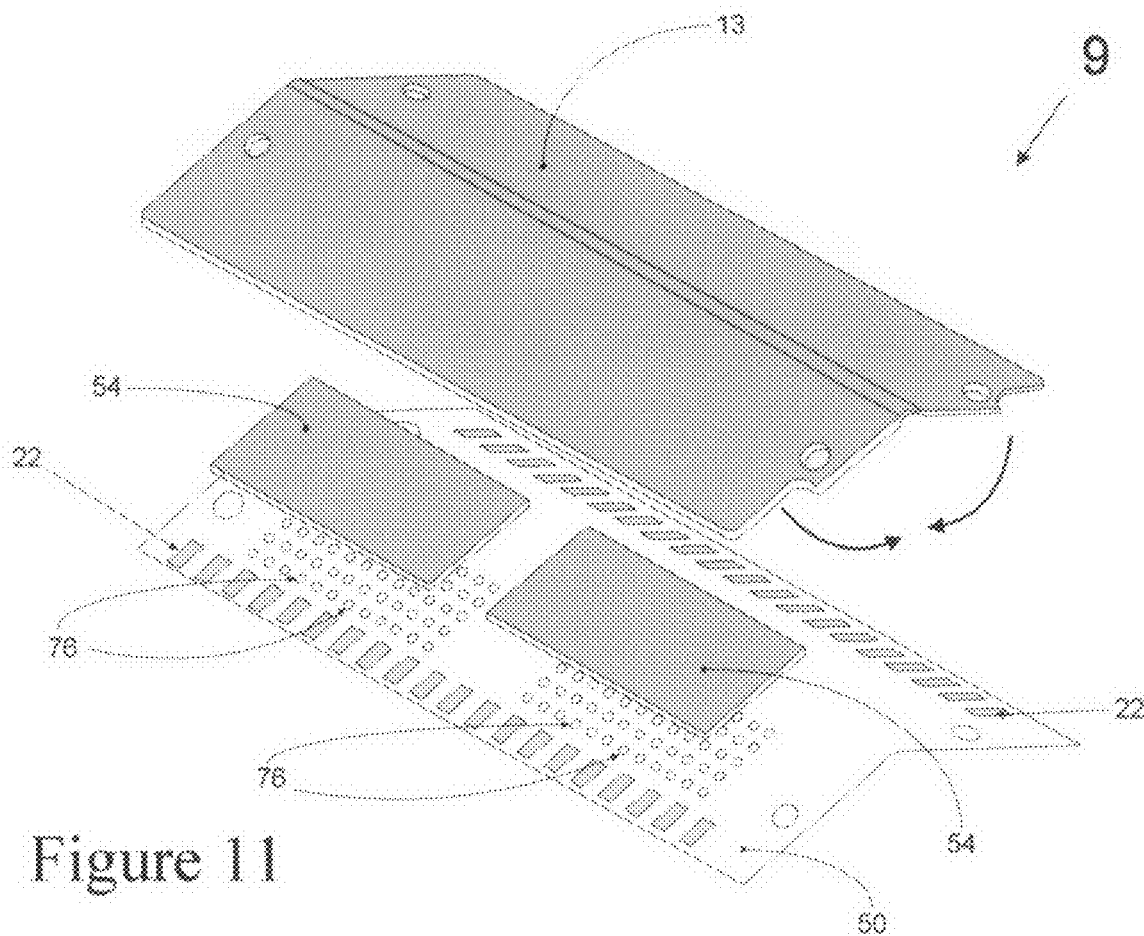
FIG. 11 is an exploded view of a module with a simple folding frame that folds in a direction opposite of that shown in FIG. 10.
Figure 12:
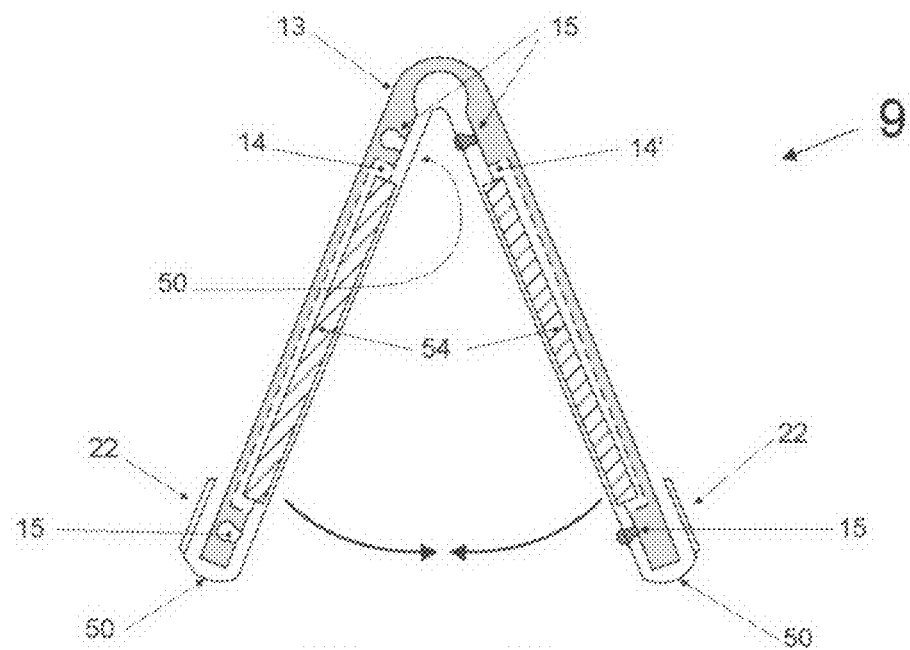
FIG. 12 is a cross-sectional view of the folding module of FIG. 11.

After Flexmodule 9 of FIG. 10 is folded together, frame member 13 is sandwiched in the middle between the first and second sections or surfaces of flex circuit 50. The flex circuit 50, in this case, surrounds the frame 13 and is exposed as the outer surfaces of the module if cover plates 48 are not present. In yet another embodiment shown in FIGS. 11 and 12, the frame and flex circuit may be folded in the opposite direction of that intended in FIG. 10, such that the flex circuit 50 and chip devices 54 are enclosed by frame 13. As shown in FIG. 12, the flex circuit of module 9 is sandwiched in the middle and is enclosed within the folded halves of frame 13. In this manner, frame 13 protects the flex circuit and chip devices similar to the molded protective overcoat 70 or cover plates 48. Referring back to FIG. 11, contacts 22 have been repositioned along the outside edges of the flex circuit, which preferably extends beyond the edges of frame 13, instead of down the centerline B-B' as shown in FIG. 10. The extended portions of the flex circuit that include contacts 22 are then wrapped around opposite ends of frame 13, as seen in cross section in FIG. 12. In this manner, contacts 22 can be brought to the outside surfaces of frame 13. In yet another embodiment of the module illustrated in FIG. 12, contacts 22 are located on both interior and exterior surfaces of frame 13 and are spaced apart similar to the module of FIG. 16. In another embodiment, flex circuit contacts 22 may terminate at the interior edge of frame 12 where they are electrically joined to metal surfaces that are incorporated as an integral part of frame 13. For example, metal contact pads may be embossed or molded onto the exterior bottom edges of frame 13 and wrap around the bottom edge 20 of the frame and provide electrical continuity to the flex circuit contacts that terminate on the interior edges.

The flex circuit contains electrical pads/contacts 22 that mate with the electrical socket contacts 34 and 34'. The position of the electrical pads in the flex that mate with the electrical socket contacts can be arrayed along the center of the flex or arrayed along the edges of the flex. When placed in the center, they are referred to as "center-connect" as shown in FIG. 10. When place at the edges, they are referred to as "edge connect" as shown in FIG. 11. In this case the pads of the center connect configuration are positioned along the center line B-B' and on the outside surfaces of the foldable frame and are in direct electrical contact with the pins in the socket. In the "edge connect" configuration the electrical pads of the flexible circuit can either be on the external or internal surfaces of the foldable frame, depending on the direction in which the foldable frame is folded. In a special case, when the "edge connect" configuration is folded such that the electrical pads of the flexible circuit are on the inside surface of the foldable frame, they can be extended in sufficient length to enable the pads to be wrapped around the edges of the foldable frame and terminate on the outside surfaces of the foldable frame as shown in FIG. 12. In another special case, when the "edge connect" configuration is folded such that the electrical pads of the flexible circuit are on the inside surface of the foldable frame, they can be electrically connected to an internal non-foldable frame 12 that contains electrical pads and which extend to form a surface for insertion into a module socket.

Multifold Full Rank Flex DIMM

The multi-fold Flex Module consists of semiconductor components mounted to and interconnected by a multilayer flexible circuit that is integrally coupled to a heat sink. This configuration is mirrored about the center plane of the module completing the assembly. The removal of heat from the semiconductor devices is accomplished by conducting heat away from the component, through the flex circuit, and directly into the cooling air stream by the means of a heat sink/heat exchanger. The forced cooling air stream (or fluid) removes the heat from the heat sink dissipating surfaces.

Figure 26:
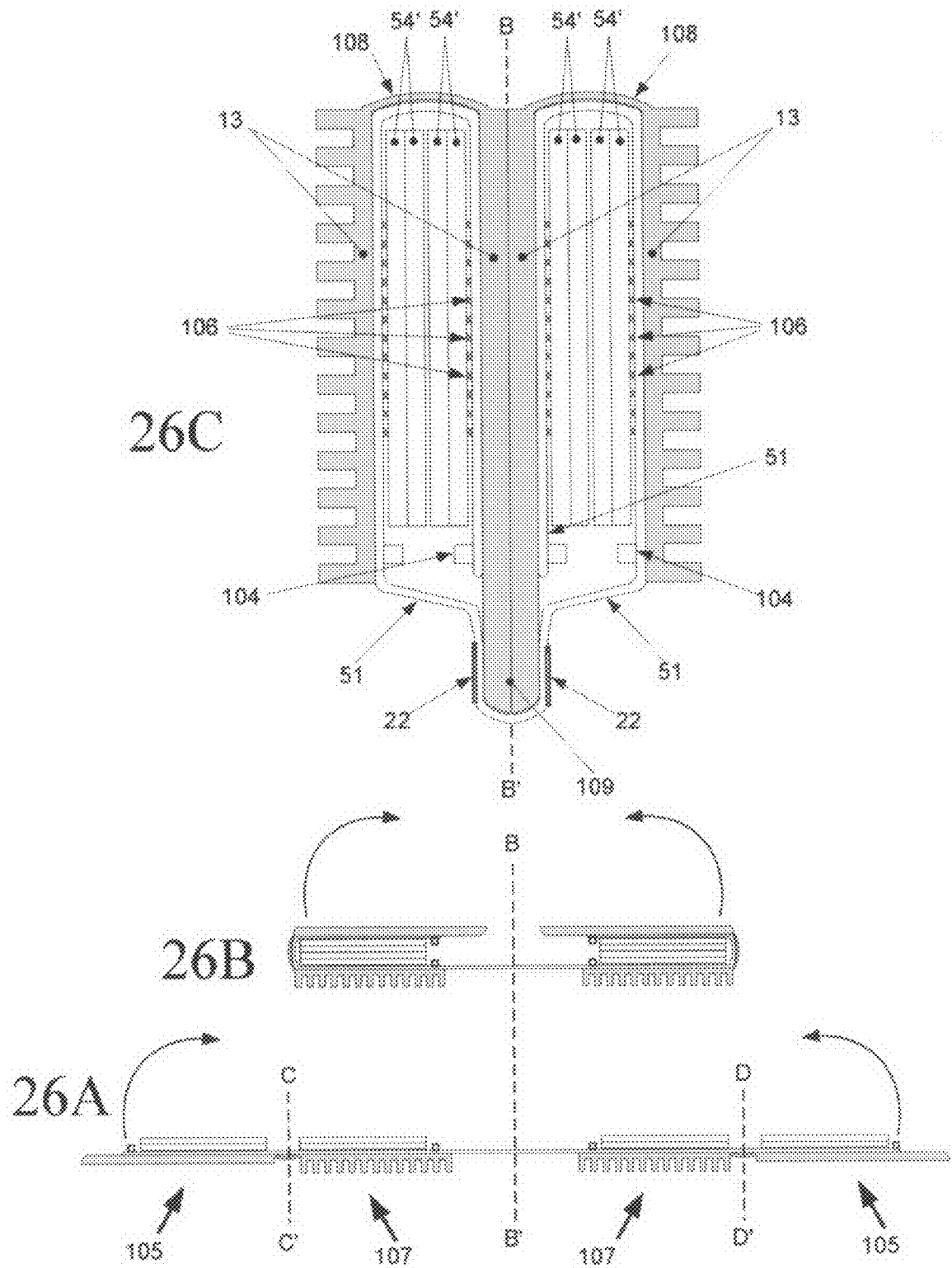
FIG. 26 illustrates a technique for forming a multi-fold flex module. Two foldable frame members, joined with a continuous flexible circuit, are folded about three axes to form a multi-fold flex module with central-mated heat-sinks which leave no gap or space at the central axis.

The innovative module packaging is shown for a full rank module (with Dual Die Package (DDP) in FIG. 26. The foldable frame 13 resides in a flat configuration (FIG. 26A) with the flex circuit already attached with the chips fully assembled. The lateral chips in the module are mounted on the outermost right and left sections-I 105 of the foldable frame 13. The outermost sections of the foldable frame 13 are articulated with the innermost sections of the frame referred to as left and right section-E 107. Once the lateral chips are folded, the module is ready for the final fold (or the folding along the central axis B-B'). The example in the figure is for a triply articulated frame.

The articulation of the foldable frame can be achieved using various means. One method is to thin down the metal areas along the folding area 108. Another method is to machine creases to enable easier folding along the folding area 108. The preferred method is to have several straight metallic sections that are articulated using pivot mechanisms 112 machined or formed in the sections. In this case, when the pivots are engaged, the foldable frame 13 can be closed in sections with minimal force. Furthermore, the foldable frame can be opened with minimal force. The low magnitude of the force required for opening and closing the frame makes it possible to open and close the frame by hand. This method is the preferred method since no special tools are required nor excessive mechanical stresses are induced on the chips.

Figure 28:
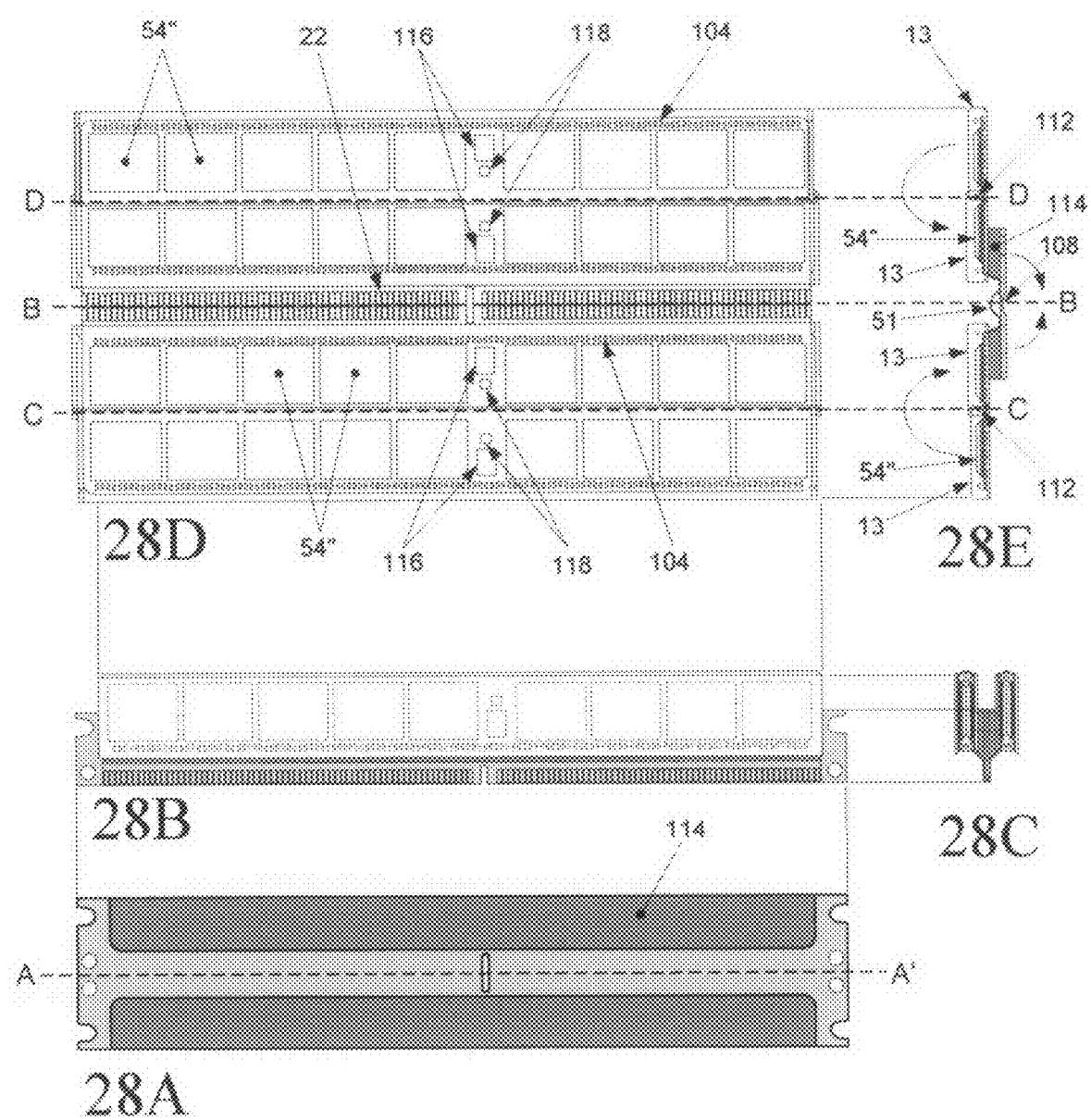
FIG. 28 illustrates a multi-fold flex module similar to FIG. 27 which contains a foldable spacer element. Two foldable frame members, joined with a continuous flexible circuit and mounted on a foldable spacer, are folded about three axes to form a multi-fold flex module with spaced-apart heat-sinks which leave a wide gap or hollow channel at the central axis.

The configuration shown in FIG. 28 is just one example of a 4 rank flex DIMM. Other folding configurations are possible. In this case the central folding is done around a foldable spacer 114 that in turn is foldable through a foldable area 108. The heat generating double-stacked chips 54" are once again positioned in the module with minimal thermal path from the solder balls 106 to the foldable frame heat sink 13. Once again, the various sections of the heat sink are exposed to a cooling fluid.

Figure 27:
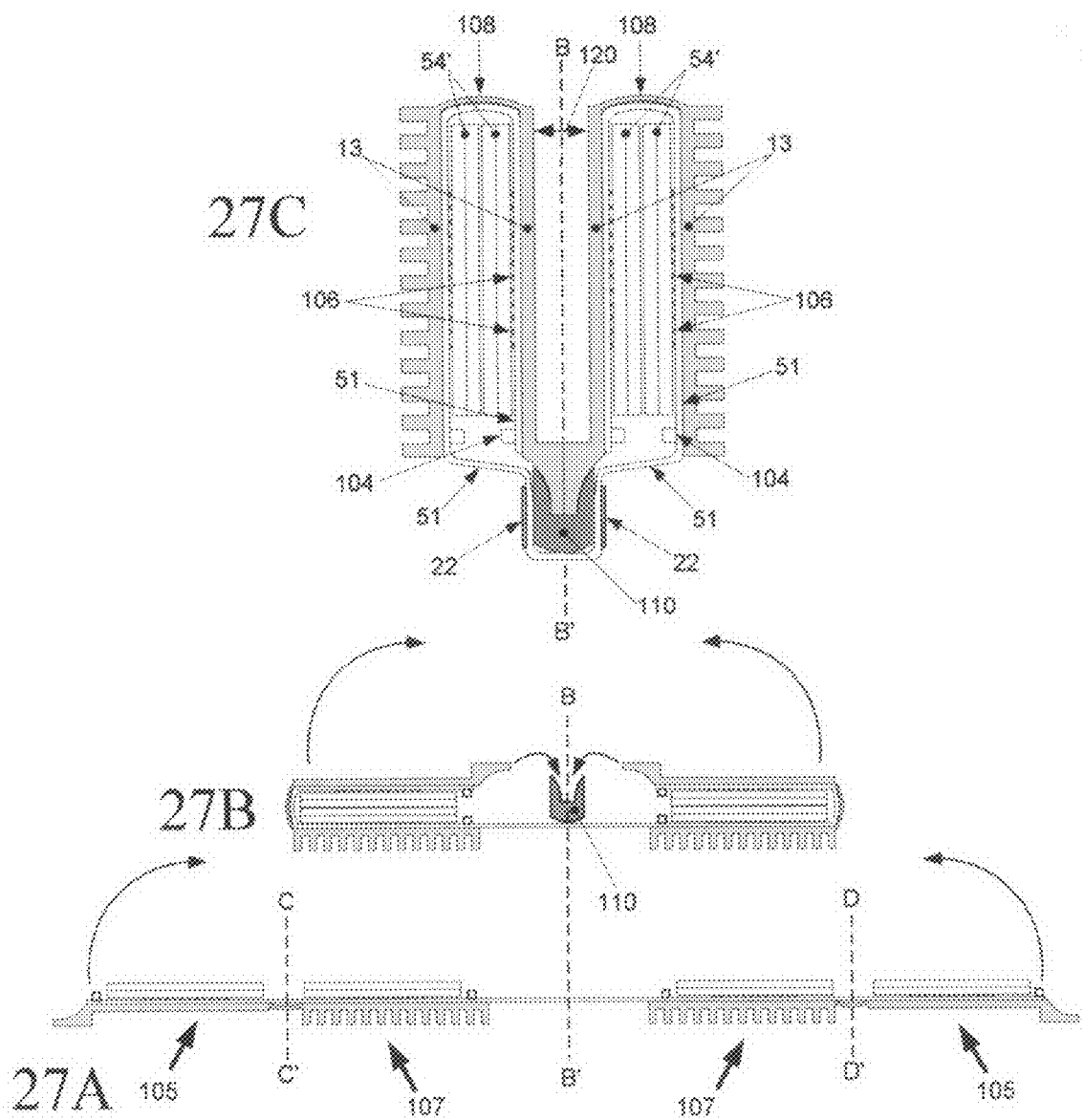
FIG. 27 illustrates another technique for forming a multi-fold flex module. Two foldable frame members, joined with a continuous flexible circuit, are folded about three axes to form a multi-fold flex module with spaced-apart heat-sinks which leave a gap or hollow channel at the central axis.
Figure 29:
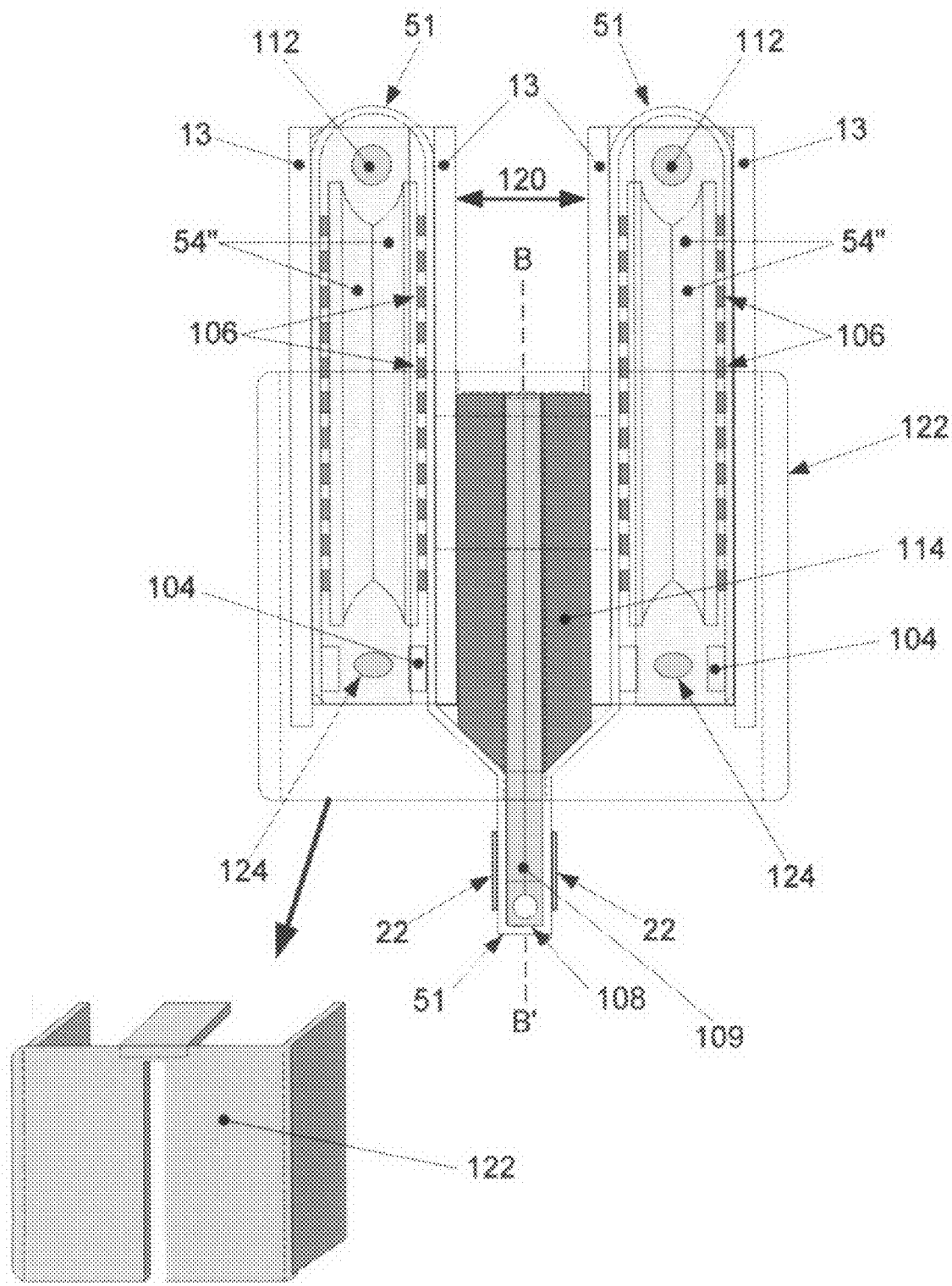
FIG. 29 is an enlargement of the cross-section (FIG. 28C) of FIG. 28. It illustrates two foldable frame members with pivot mechanism and snap latch mounted to a foldable spacer. An example of an end retainer, suitable for locking the multi-fold flex module together, is illustrated.

The multi-fold modules in FIGS. 27, 28 and 29 have four heat exchanging surfaces in the folding frame 13. The modules with one folding axis in FIGS. 30 and 31 have two heat exchanging surfaces 48.

Single Fold Full Rank Flex DIMM

Figure 30:
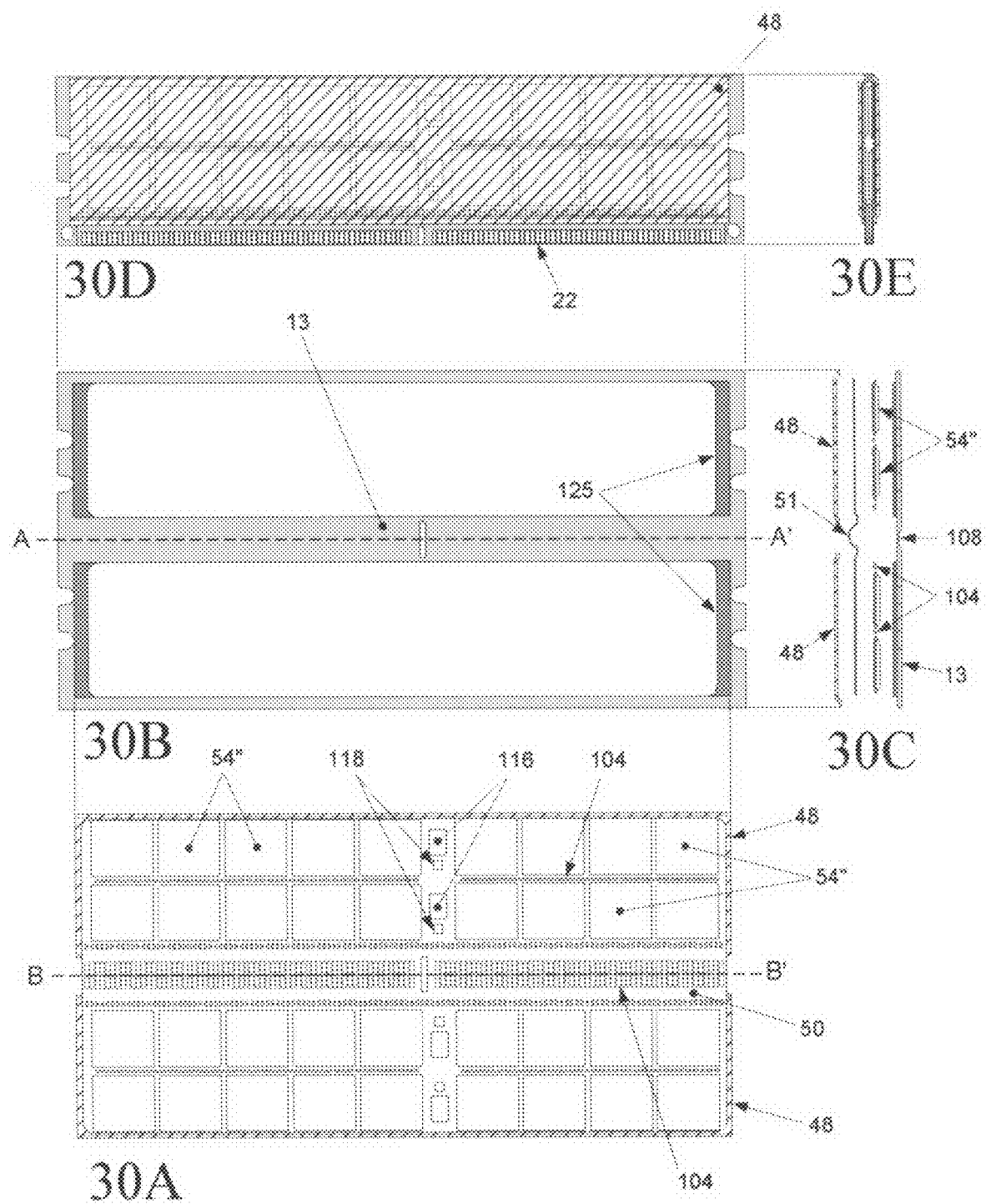
FIG. 30 illustrates the assembly sections and sequence of a folded flex module. The flex circuit is shown laminated to two coverplate heat-sinks with two rows of stacked chips on both sides of the module. This subassembly is then bonded to a foldable frame, in a flat configuration, which is later folded about a single axis into its final form factor.

FIG. 30 illustrates an example of a full rank module, using a foldable frame module with a single fold in flex circuit and the foldable frame. Several steps are illustrated in FIG. 30A-E. Foldable frame 13 in this case allows for a hollow internal structure to host the chips. The chips are sandwiched between Flexible circuit 51 and cover plates 48. In cases where chips 54" are thicker that the spacing allowed by frame 13, riser sections 124 may be used to positioned cover plates 48 away from the center line A-A' and B-B'. FIG. 30A shows additional chips including a register chip 116 and Phase Lock Loop (PLL) and passive devices 104.

Figure 31:
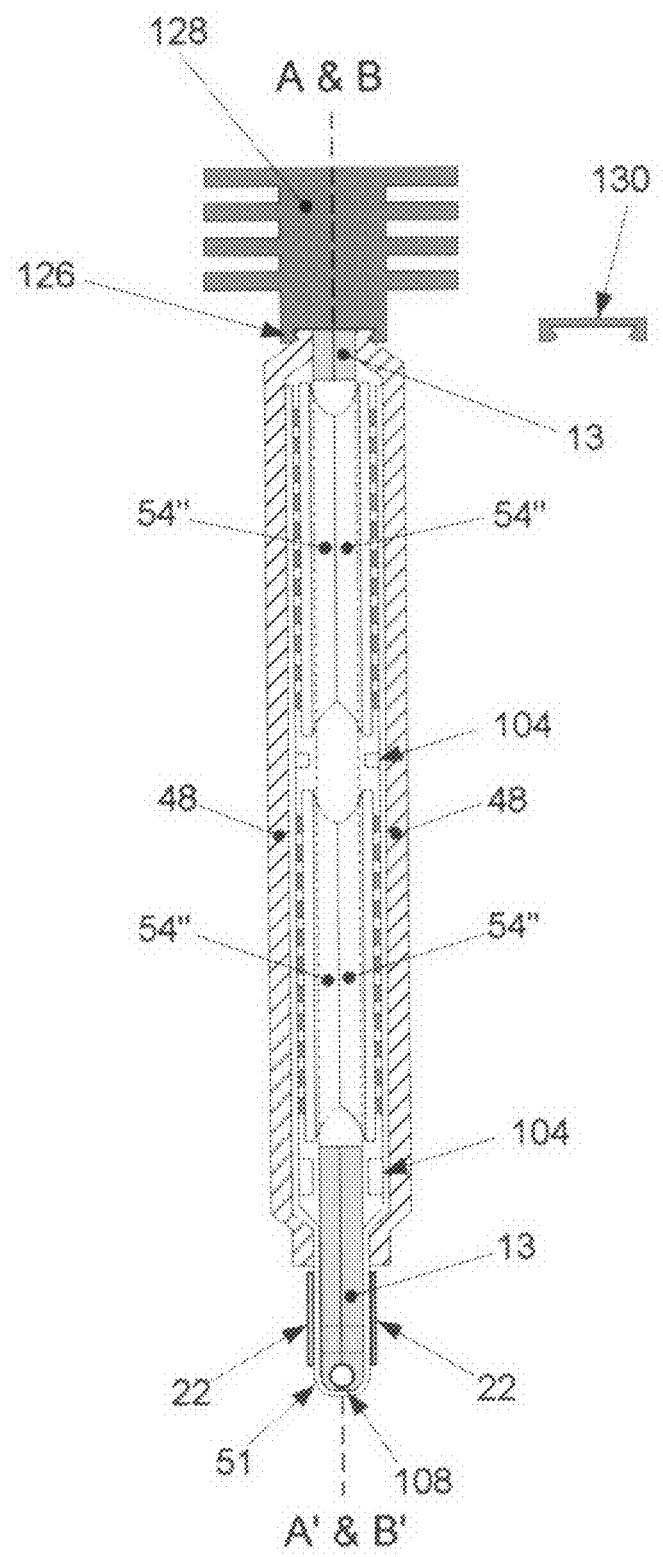
FIG. 31 illustrates an enlargement of the cross-section (FIG. 30E) of FIG. 30. It illustrates two internal rows of chips meeting back-to-back at the centerline of the foldable frame member of the flex module and examples of two removable top retainer features for clamping and holding the flex module in a closed configuration. One top retainer includes a heat exchanging extension.

An expanded view of FIG. 30E is provided in FIG. 31. As illustrated the top section of the module is held together mechanically by using a top retainer 128 or 130. The top retainer 128 has thermal dissipative characteristics. Both top retainers 128 and 130 clip to the top of the module using a retaining bevel 126.

As stated earlier, the present invention can be easily adapted for mating with existing SIMM and DIMM sockets. However, these sockets were designed to allow adequate clearance of pre-packaged components (e.g. SOJ, TSOP, VSOP) disposed on the exterior surfaces of the SIMM and DIMM circuit boards. Hence these older surface mounted modules require greater spacing between adjacent rows of modules than is required by the modules described herein. Newer sockets are therefore anticipated that will enable modules of the present invention to be positioned more closely together. An example of such a socket connector is illustrated in FIG. 13 and represents a new and novel design for connecting multiple modules to a mother circuit board with a minimum profile height above the motherboard.

Figure 13:
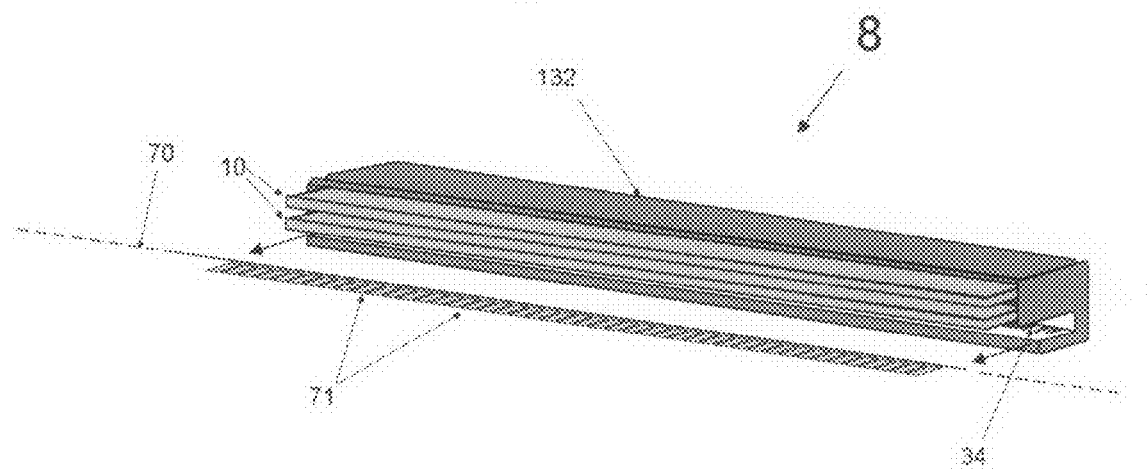
FIG. 13 is a perspective view of an edge-card socket designed to mate with two modules similar to that illustrated in FIG. 2. It shows the socket and two inserted modules about to be placed as an assembly onto the edge of a motherboard circuit.

FIG. 13 is a perspective view of a module connector or socket 12 intended to be connected to the edge of a motherboard 70. It shows two modules 10 inserted into socket 12, which is about to be mated to the edge of a motherboard as an assembly 8. This socket differs in several respects from existing SIMM and DIMM sockets. The later connectors are typically soldered directly to the top surface of the motherboard and, therefore, are permanent fixtures of the motherboard that are generally accessible only when a substantial portion of the motherboard is exposed for access. This typically necessitates the removal of a computer's plastic encasement or cover to gain access to the motherboard. Since existing SIMM and DIMM sockets are soldered directly to the motherboard, they require the services of a professional electronic repair shop to properly remove and replace the sockets if they should become damaged. The socket 12 of FIG. 13, however, is designed to be press fitted onto the edge of the motherboard and, therefore, can be easily removed by the user as needed. An additional advantage is that only a section of an edge of the motherboard needs to be accessible in order to insert or remove the socket 12 of the present invention. A further advantage is that because the inventive socket assembly is not soldered to the motherboard, the structural member or housing may be injection molded from low-cost polymers having a glass transition temperature ($T_g$) less than about 120° C., which also have desirably low dielectric constant (preferably less than about 4).

Another benefit of the module-socket combination 8 illustrated in FIG. 13, is that the resultant assembly can enable the modules to be mated to the motherboard in a lower profile than is achievable with existing SIMM, DIMM and other fixed socket products. Since the socket and inserted module assembly 8 is essentially parallel to the plane of motherboard 70 and clamps around the edge of the motherboard, with a portion of the socket projecting inward across the bottom surface of the motherboard, the resultant assembly 8 profile can be maintained fairly close to the surfaces of the motherboard. This is an important feature that would benefit emerging new portable products such as handheld Personal Digital Assistants (PDA), notebook computers and cellular telephony products, where component height must be strictly limited in order to hold the overall product thickness to a minimum.

Figure 14:
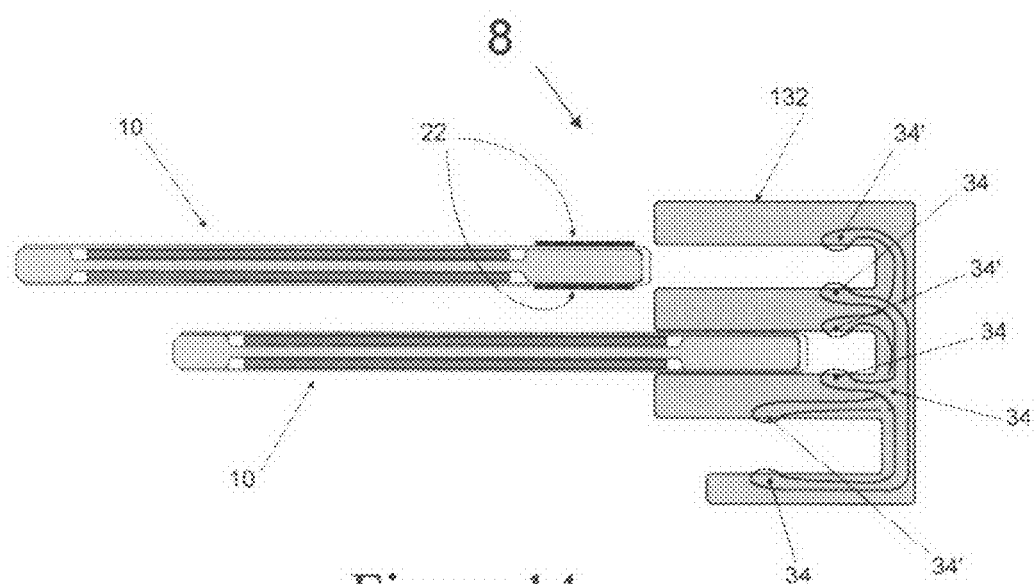
FIG. 14 is a cross-sectional view of the edge-card socket and inserted modules of FIG. 12. It shows one module partially inserted into the edge-card socket and the other slightly withdrawn from the connector. The edge-card socket illustrated accepts two modules, however more modules can be disposed above or below the plane represented by the motherboard. Another slot shown is reserved for engaging contacts on the edge of the motherboard.

FIG. 14 is a cross sectional view of the socket and module assembly 8 of FIG. 13. Referring to both FIGS. 13 and 14, it can be seen that the socket 132 attaches to the motherboard 70 similar to the way in which a daughter card is inserted into an edge-card connector, with exception that in this case the socket is being "onserted" or inserted onto the finger contacts 71 of the motherboard 70, rather than the other way around. Normally, SIMM and DIMM sockets are pre-assembled on the motherboard before the modules are inserted into the sockets. In the inventive socket, the modules 10 are first inserted into the socket body 132 and then the socket and module assembly 8 is placed onto the main motherboard 70.

FIG. 14 further illustrates that individual contact pins 34 and 34' within the socket body are electrically bussed or physically linked from slot-to-slot. In other words, each socket contact pin 34 or 34' is physically connected to other contacts in adjacent slots that reside in the same relative position, and provides a path for electrical continuity from a specific finger contact of the motherboard to similarly positioned finger contacts on one or more modules 10 inserted into the socket. The socket contact pins 34 and 34', illustrated in FIG. 14, would typically be formed by stamping the shape from a flat piece of metal and would require no further forming or bending before being inserted into recessed apertures molded into the base of the socket body. To provide independent access to contact fingers 22 located on opposite sides of module 10, the contact pins 34 would typically be positioned in a staggered arrangement relative to other adjacent contact pins 34'. Pins 34 and 34' would then typically alternate in establishing front and backside contact of the module(s) and motherboard. It should be noted that socket 132 of FIGS. 13 and 14 may provided more module slots than depicted in these illustrations; and that these slots may be advantageously disposed above and below the point at which the motherboard engages the socket. Furthermore, although the edge-card socket, shown in FIGS. 13 and 14, is the preferred connector type for mating to the motherboard, a male/female, pin and socket, connecting apparatus (not shown), similar to existing PCMCIA card connectors, may also be substituted. For example, socket 132 may be divided into two mating halves: a female socket portion, which is permanently soldered to the motherboard, and a separate male-pin portion, integrated in that half of socket 132 which holds modules 10. To connect the modules 10 to the motherboard 70, in this case, the male-pin portion of socket 132 would be inserted into the female socket, residing on the motherboard. Of course, the relative role of male and female halves of this example could also be reversed. It should also be noted that contact pins 34 and 34' may vary widely in proportion and shape from those depicted in FIGS. 13 and 14, and are not required to be physically or electrically bussed together to remain within the scope of this embodiment.

Figure 24:
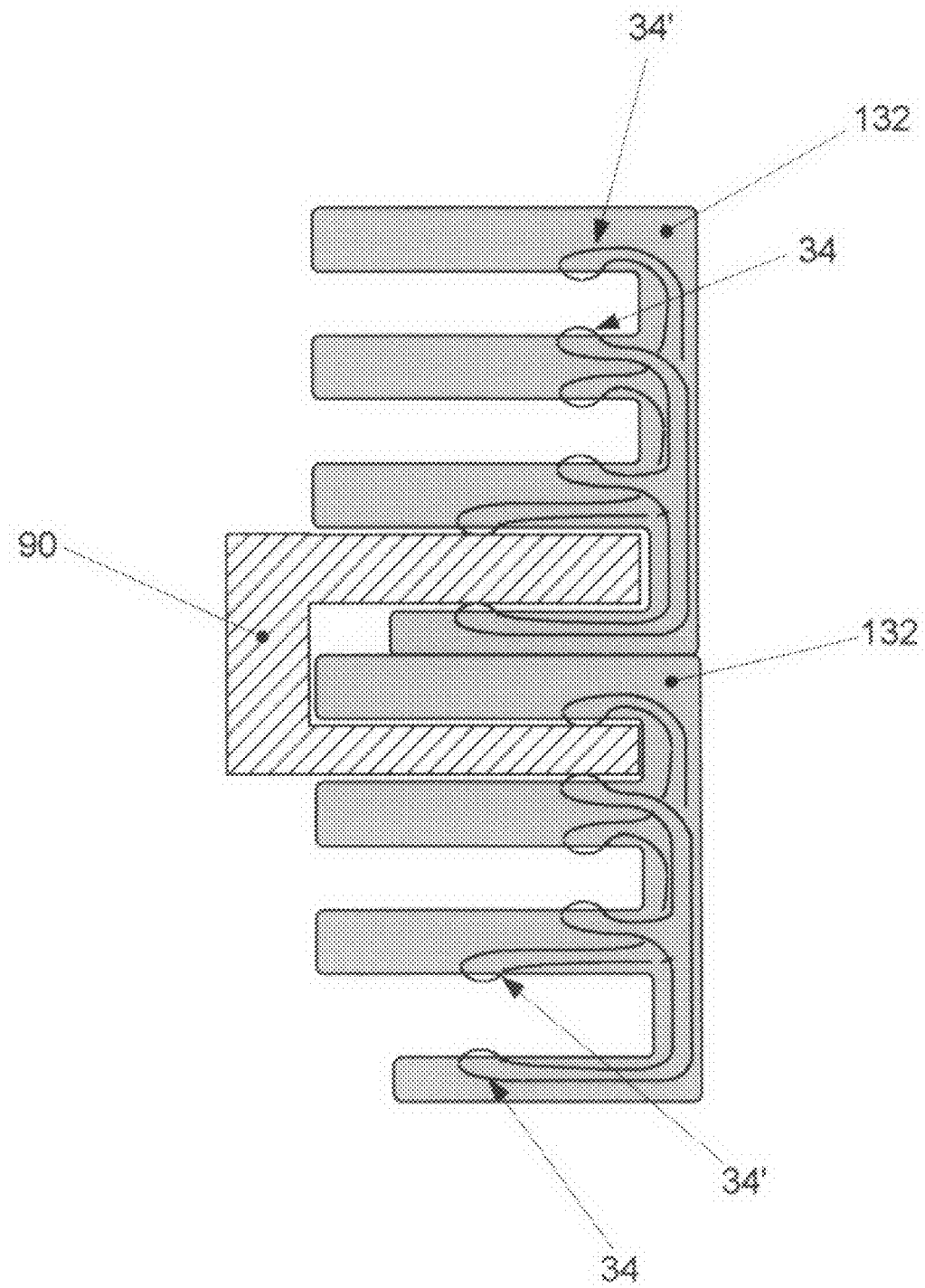
FIG. 24 is similar to FIG. 14, but illustrates two edge-card sockets joined with a coupling section which acts as a bridging circuit to enable the two sockets to be mechanically and electrically joined together to function in unison and as a single socket. This increases the number of flex modules that can be mounted in a vertical stack.
Figure 25:
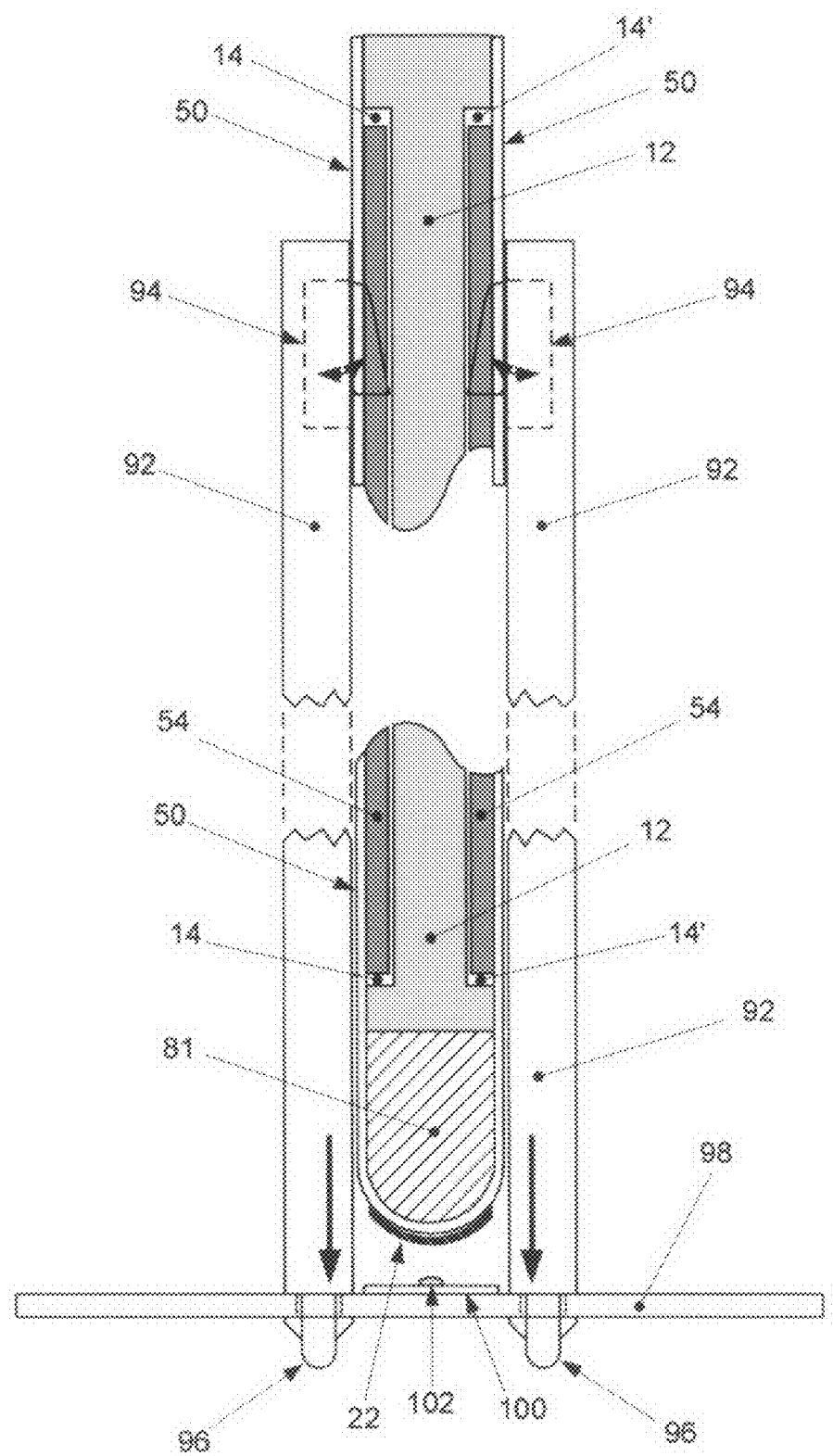
FIG. 25 illustrates the flex module of FIG. 18, with bottom contact pads, inserted into a special socket designed to guide and latch the flex module in compression onto bumped contact pads of the motherboard surface.

Because the socket assembly 132 is modular, it may easily be expanded as shown schematically in FIG. 24. Here, an adaptor 90 has two male connector strips, one of which is adapted to fit into an edge-card socket of a first assembly 132 and a module socket of a second assembly 132 whereby the combined socket assembly has a capacity of holding three modules versus two. It will be appreciated that any number of socket assemblies and modules may thus be combined or ganged in parallel, giving the user wide latitude to expand system capacity.

Turning now to FIG. 15, an exploded cross sectional view of yet another embodiment of the present invention can be seen. FIG. 15 illustrates two modules 9 and 10 interconnected with a single continuous strip of flex circuit film 51, and shows the modules being folded in the direction of the arrows, in an accordion-like manner, to form a double-joined module 11. Module 9, shown on the left half of FIG. 15, represents a cross sectional view of the foldable module illustrated in FIG. 10. Frame 13 of module 9 includes molded features 15 for enabling the frame to be snapped and locked together. Module 10, located on the right half of FIG. 15, is similar to that shown in FIG. 2. Although two differing frame members 12 and 13 are represented in FIG. 15, in actual practice the double-joined module 11 would typically use the same kind of frame in both halves, as indicated in FIG. 16. A heat sinking spacer element 16, or battery 49, similar to that mentioned in connection with FIG. 4, is position at the center of the module. Two metal plates 48 are also attached to the outer surfaces of the double-joined module 11 to provide a rigid, protective covering.

FIG. 16 is a cross sectional view of a double-joined module 11, similar to FIG. 15, that is being inserted into a double-rowed socket 7 designed to mate with this module. The contacts 22 of module 11 are arrayed along both first and second exterior surfaces of the two edges that extend past the bottom of spacer element 16. This configuration provides four surfaces from which signals can be communicated to and from the motherboard. The socket contact pins 6 shown in FIG. 16 engage with contacts 22 of module 11 and provide a means for electrical communication between the motherboard 70 and the module 11.

Three rows of contact pins 6 and 6', of socket 7, are illustrated in the cross section shown on left side of FIG. 16. Pins 6 and 6' represent the same pin oriented in opposite directions to face the interior of slots 5 and 5'. Slots 5 and 5' receive the two edges of module 11 when it is inserted and pins 6 and 6' engage with contacts 22 of module 11. The center row of socket contact pins 6 and 6' engage the separate slots in an alternating fashion. In other words, separate but adjacent pins 6 and 6', of the center row, face in opposite directions as illustrated.

In another embodiment of socket 7, illustrated on the right side of FIG. 16, the center row contact pins 6" are bifurcated and face in both directions. This enables electrical signals to pass from module-to-module through the center row pins of socket 7, or for a signal, voltage or ground potential to pass to or from both halves of module 11 through the same pin. It should be noted that electrical communication between adjoining modules of this embodiment would typically occur through conductive traces routed across the section of flex circuit that interconnects the left and right halves together across the top of module 11. However, as noted, an alternative or supplemental communication path can be established from module-to-module through a bifurcated pin located in the center row of socket 7. It should also be noted that the bifurcated contact 6" would not necessarily occupy every available site within the center row of socket 7, and that a combination of pins 6, 6' and 6" would typical occupy the center row.

Figure 17:
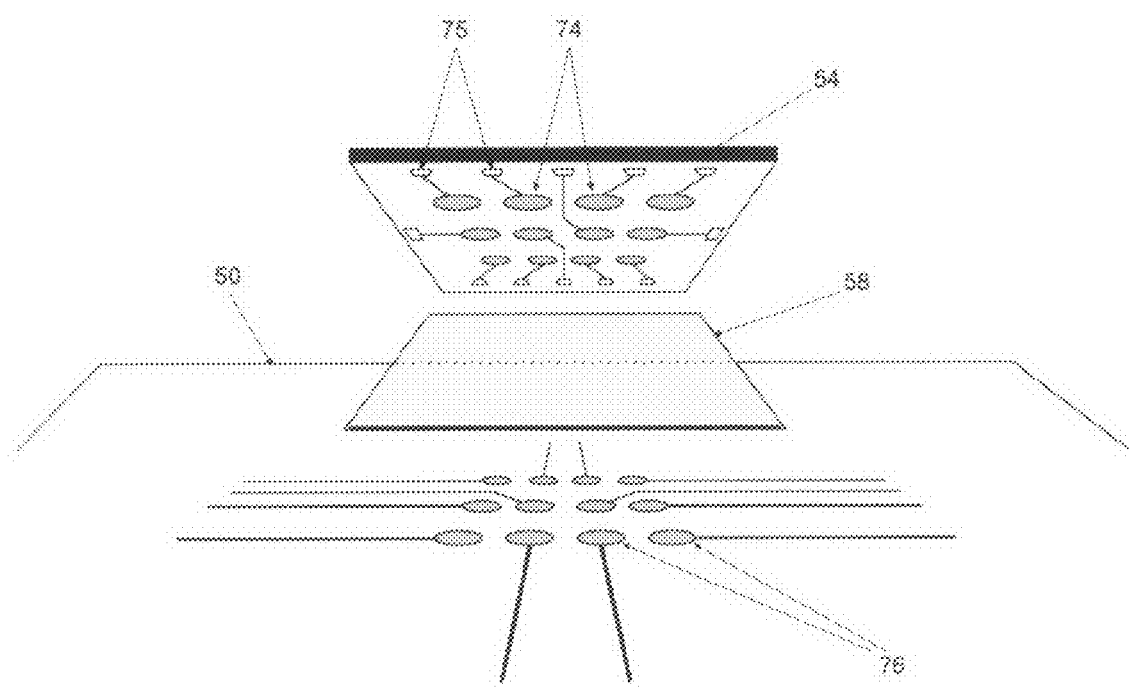
FIG. 17 is a perspective view of a preferred method for connecting IC chips to the flex circuit substrate.

Turning now to FIG. 17, a perspective view illustrates the preferred dice mounting technique previously discussed. Arrayed across the active surface of semiconductor device 54 are contact pads 74 arranged in a grid fashion. Pads 74 are shown interconnected through electrically conductive traces to smaller bonding pads 75 disposed around the perimeter of device 54. The pad array and conductive traces illustrated on device 54, are typically vacuum deposited thin metal films adhering directly to the passivation surface or polyimide die coating of the semiconductor chips. Examples of thin film metals that are suitable for this application include: aluminum, copper, nickel, gold, titanium-tungsten, and other metals and metal alloys. Patterns of interconnecting traces and arrayed pads are typically fashioned by traditional photolithography processes and by sputtering or evaporating thin metal films through a stencil mask. The stencil mask may be formed of etched patterns in polymer photoresist material that is applied directly to the surface of the IC wafer and later removed, or etched patterns in a separate thin stainless steel overlay that is aligned to the wafer and held in place during the thin film deposition. In this manner, the normal IC bond pads, distributed along the perimeter of the chips or down a centerline, are redistributed to an array of contact pads 74 across the interior surface of device 54.

Alternative processes for producing an array of pads 74 and interconnecting traces on device 54 include the use of screen printed, metal-filled, conductive polymer inks, patterned transfers and thin flex circuit decals similar to those presently being developed by Tessera Inc. (San Jose, Calif.).

Referring again to FIG. 17, it can be seen that an array of contact pads 76, matching those of device 54, are disposed on the surface of flex circuit 50. Interposed between device 54 and flex circuit 50 is a thin film or coating of anisotropic conductive adhesive material 58. Adhesive material 58 is applied as a liquid or thixotropic paste, by using a syringe or by screen printing the material on the surface of device 58 or flex circuit 50 prior to assembling device 54 to flex circuit 50. Alternatively, adhesive 58 may also be applied as a dry or semi-dry preform. Although the extent of adhesive coverage, as illustrated in FIG. 17, would typically span the entire surface area under device 54 for mechanical reliability considerations, in some instances only the area delineated by the device contacts 74 would receive adhesive 58. In other words, adhesive 58 would be applied in one or more narrow strips or in a "dot" pattern covering only pads 74 or 76 prior to assembly. After device 54 is aligned and placed over pads 76, the adhesive 58 either self-cures at room temperature or is cured by subsequent application of heat, microwave, or light (UV) energy. In some instances, in order to insure low ohmic contact resistance between pads 74 and 76, a raised conductive (metallic) bump may be necessitated on pads 74 and/or pads 76. Also, some amount of pressure may be required to be exerted between device 54 and circuit 50 until the adhesive is sufficiently cured.

An alternative means for enabling electrical and mechanical attachment of device 54 to circuit 50, substitutes a particle impregnated PSA tape for adhesive material 58. Pressure Sensitive Adhesive (PSA) films, such as those manufactured by 3M, may be impregnated with electrically conductive particles, that are either randomly distributed throughout the film or patterned in a grid array fashion, for the purpose of providing a means for conducting electrical signals through the thickness of the film in a manner similar to anisotropic conductive adhesives. To accomplish the DCA process using the particle-filled PSA film 58, the film would be applied to either device 54 or flex circuit 50, the parts would be aligned, and then simply pressed together. Examples of suitable electrically conductive particles include, but are not limited to: carborundum, carbon, carbon nanotubes, metallic coated diamond dust, gold-tin alloys, and other hard, sharply pointed materials capable of spanning the bond line thickness of the adhesive film and piercing through isolative oxide films or coatings that may form on pads 74 and/or 76. In addition to providing chip-to-circuit board or chip-to-flex DCA capability, it is anticipated that this material can be used for interconnecting laminate layers within multilayered circuit boards and flex circuits.

Alternative Edge Contact Designs

Figure 18:
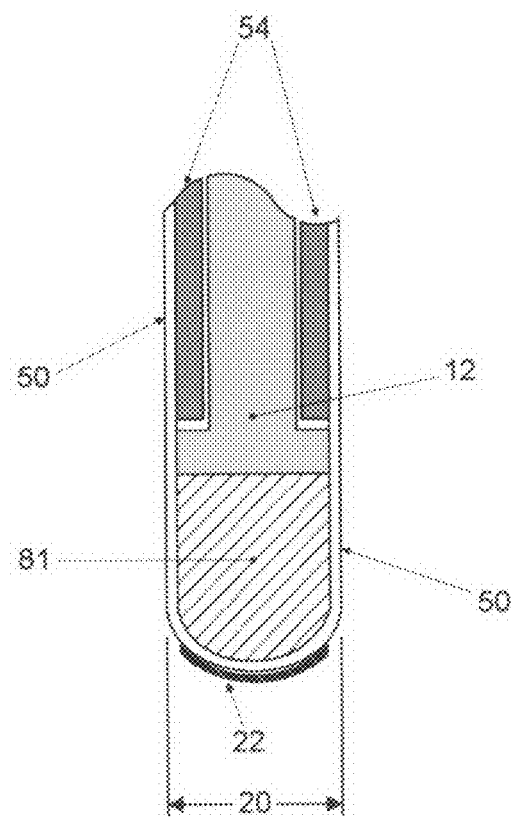
FIG. 18 is a cross sectional view of the bottom portion of a module which employs an elastomeric material at the base of the frame to impart a spring-like compliance to the flex circuit contacts. The contacts on this embodiment are also repositioned along the bottom edge of the module.

FIG. 18 illustrates yet another embodiment of flex-module 10 in which contacts 22 are repositioned along the bottom edge 20 instead of first or second exterior surfaces of flex circuit 50 as previously described. In this embodiment, an elastomeric material such as neoprene or silicone rubber 81 is incorporated along the bottom edge of frame 13 to impart a resilient and compliant characteristic to the contacts disposed along the bottom edge 20 of flex circuit 50. This embodiment is intended to enable module 10 to engage the contact pins of a socket (not shown) in a compliant manner. When placed into a socket specifically designed to function in a spring-like, compliant manner, the module may then be able to self-eject. For example, when module 10 is inserted into the slot of a socket designed for this application, the module would be pressed into the slot of the socket with sufficient force to compress the resilient and compliant contacts 22, until a mechanical interlock or latch on the socket is activated and locks the module frame in place; holding the module against the socket pins with sufficient normal force to ensure a reliable electrical connection between the module and the socket. To disengage the module from the socket, an additional force (a force larger than that used to insert and engage the module) would be applied to the module (in the same direction as was applied to engage the module into the socket) until the mechanical latch or interlock disengages, at which point the resilient nature of the module contacts would tend to cause the module to spring away or self-eject from the socket. In other words, this embodiment is intended to engage with sockets designed on a "straight-in, straight-out, push-to-lock, push-to-eject" principle that works in unison with an elastomeric material incorporated into the base of module 10. Alternatively, or to provide additional resiliency, the socket can be designed to incorporate an elastomeric conductor material, similar to that manufactured by Elastomeric Technologies Inc. (Hatboro, Pa.).

A frequent engineering problem encountered when designing socket connectors for modules that incorporate large numbers of contacts, involves the inevitable high insertion and extraction forces that accompany standard "push-pull" connector designs. The "push-pull" socket, otherwise known as the "straight-in, straight-out" socket, is perhaps the simplest connector to design and manufacture, and consequently the lowest in cost. Generally, it is also the easiest and most intuitive to operate and (of significant importance to the present invention) enables the modules to be compacted more closely together than other known socket concepts. However, the amount of force required to insert and remove a module from a particular socket connector, is a direct function of the number of connections and the normal force exerted by individual socket pins against the contacts of the module. Assuming the normal force remains fixed, as the number of connections increases, the force required to insert or extract the module increases proportionally.

Figure 19:
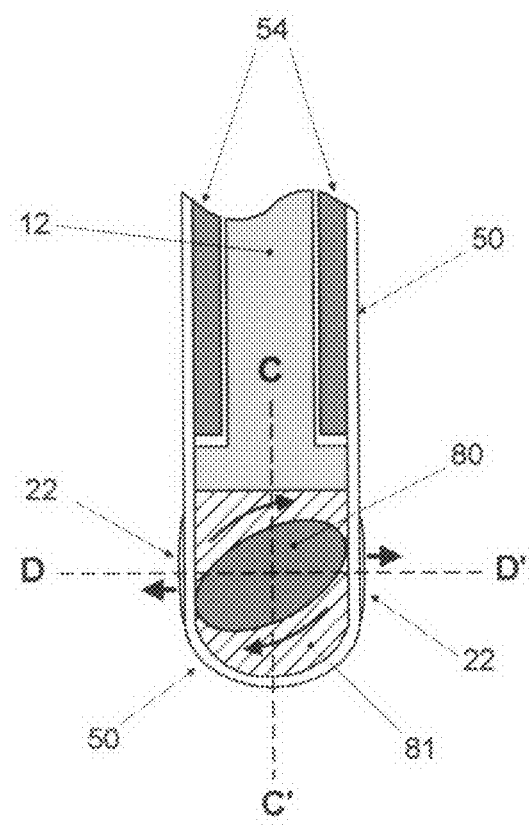
FIG. 19 is a cross sectional view of the bottom portion of a module similar to FIG. 18 and includes a cam-like element that, when rotated, exerts an outward force or pressure behind the flex circuit contacts. This feature is intended to enable the module to be more easily inserted and removed from a mating socket.

The number of contacts required for memory modules is already fairly high. Memory modules typically employ a large number of data I/O pins and address lines in order to obtain maximum performance when interfaced with newer microprocessors. Newer processors use large "word-widths" (e.g. 8-bit, followed by 16, 32, 64 and eventually 128-bit) and in the future, memory modules will need even more contacts. Consequently, the forces required to insert and remove a memory module from a socket will steadily increase and has already reached the point where "push-pull" connectors are impractical. In anticipation of this trend, an embodiment of a module is represented in FIG. 19, which incorporates a "zero force" (ZIF) or "low insertion force" (LIF) contact. This feature is built-in as part of the module itself, and is intended to extend the usefulness of "push-pull" or "straight-in, straight-out" connector sockets.

Turning to FIG. 19, a bottom portion of module 10, similar to FIG. 18, is shown in cross section, which illustrates a rotating cam element 80 positioned at the base of frame 13. Elastomeric material 81 preferably surrounds element 80 (it should be noted that elastomeric material 81 is not necessarily required for the proper operation of the embodiment of FIG. 19). Cam 80 extends along the length of frame 13 and is preferably attached to a lever near one or both ends of frame 13. When the lever arm is rotated, cam element 80 rotates between two elongated positions; one position parallel to axis C-C' and the other position parallel to axis D-D'. When cam 80 is elongated parallel to axis C-C', the edge thickness 20 is reduced to a minimum width, and the module can be inserted and withdrawn from its mating socket (not shown) with little or no resistance (i.e. "zero force"). When cam 80 is elongated parallel to axis D-D', the cam exerts an outward force against the first and second interior surfaces of flex circuit 50, displacing contacts 22 in an outward direction as indicated by the arrows. Edge thickness 20 reaches a maximum width and produces a normal force acting against the socket contacts. In effect, flex circuit 50 and contacts 22 are pinched or wedged between cam 80 and contact pins disposed on the socket into which the module is inserted. This "wedging" action also helps to hold or lock the module into the socket.

Internal Module Cooling Designs

A new type of internal cooling technology is disclosed herein that addresses IC heating issues in memory modules. The inventive concept is applicable to other semiconductor devices besides memory chips (including but not limited to microprocessors). Compared to existing externally applied cooling media, such as water and or air, applied to the surfaces of heat sinks attached to chips, the present invention allows for direct cooling on to the surface of the chips that are enclosed in an environment specially designed to channel the heat out of the module. This innovative technique for cooling modules offers better heat radiation performance, smaller and lighter specs, and cheaper manufacturing. The new technology is under development by Soliton R&D Corp. of Japan, a technology start-up involved in R&D of flexible circuit boards.

The basic approach is to form an extremely fine network of channels through Cu foil, passing the water or other cooling medium. Eventually the developers hope to form it as an integral part of the printed circuit board (PCB) or flexible circuit. Conventional water-cooling modules use metal pipes to connect components such as the heat receptor (water-cooling jacket), which actually absorbs IC heat, and the radiator to dispose of it. Soliton's technology achieves significantly better efficiency by building these components inside the Cu foil of the flexible circuit. It will be appreciated that the "Soliton" approach may readily be incorporated into Applicant's design concepts.

The following example includes designs and methods by which the memory module packaging accommodates both electrical and thermal management requirements.

FIG. 20 is a cross section view of a Flex-module 10 similar to that shown in FIG. 5. The interior frame 12, however, is substantially hollow 79 to allow the passage of a cooling gas (e.g. inert gas or air) or liquid (e.g. water). A tapered orifice 77 is illustrated in the bottom of the module frame 12 and is intended to be coupled to an inlet port 80 and/or outlet tube 81 (not shown) or channel incorporated as a part of the module mating socket 7', such that when the module is inserted into the socket to engage with the electrical contacts 6' arrayed along the length of the socket 7', one or more orifices 77 disposed along the length of the module frame 12 simultaneously engage with inlet and/or outlet ports 80,81 incorporated with the socket. As the module is pressed downward to make electrical contact between pads 22 of the module and contacts 6' of the module socket, the inlet/outlet ports 80 and 81 engage and protrude into the tapered orifices 77 of the module frame 12 and are hermetically sealed against a rubber or elastic ring or grommet 84 that is intended to prevent leakage of the circulating coolant. It will be appreciated that the inventive socket may contain such ancillary features as guides or other alignment structures, latching mechanisms to keep the module securely seated in the socket, etc., as are well known in the art. The distal ends 82 of the socket inlet/outlet ports are intended to protrude through the printed circuit board 70 and to mate with plumbing hardware (e.g. poly-tubing) that would deliver and remove a cooling agent to the interior of the cavity 79 fashioned within the module frame or formed as a result of a hermetic seal 85 around the perimeter of the module's flexible circuit 50 and frame 12 as illustrated in FIG. 21. It will be appreciated that the structural components of the module are sufficiently rigid to prevent flexural damage to the chips caused by pressure differences between the module interior and the external environment.

The frame 12 illustrated in FIG. 20 would preferably be formed from a thermally conductive material (e.g. copper, and other metals) to enable rapid conduction of heat from the contained semiconductor devices to the circulating gas or liquid material within the central core 79 or cavity of the module frame. Alternatively, the frame may consist of both a rigid perimeter and compressible, bladder-like, central portion that would physically contact with semiconductor devices on either side of the bladder to provide both thermal cooling and protection against externally applied forces that might otherwise cause the cover plates to flex and damage the enclosed semiconductor devices. Assuming that the central portion of frame 12 is otherwise rigid, the semiconductor devices would be in close proximity and in direct thermal communication with either the thermally conductive frame or directly in contact with a circulating gas or liquid material. A thermally conductive adhesive, coating or filler (not shown) may be used to provide direct thermal communication between the surfaces of the semiconductor devices closest to the centerline of the module frame and the outer wall of a central cooling cavity 79.

An alternative module-cooling configuration is illustrated in FIG. 21. In this example an outlet port for the circulating coolant is located at the top edge of the module. In this configuration one or more inlet ports 77 would enable the coolant to enter an interior cavity and to exit the module through one or more ports incorporated into the top edge of the module frame 12. Conversely, the coolant flow may be the reverse direction described above. In this example, an interior cavity 79 is created by a hermitic seal existing between the flexible circuit 50 (and/or the external cover plates 48) and the module frame 12. This hermetic seal can be obtained by using an appropriate sealant adhesive or by thermo-sonic bonding or welding of the contacting surfaces. Alternatively, an internal flexible bladder, as previously discussed, may be used to prevent leakage of the enclosed fluid.

In FIG. 20 the flexible circuit 50 is mechanically and thermally attached to cover plates 48. The flexible circuit may also optionally provide an electrical grounding contact to the cover plates. Stacked semiconductor chips 54" are in turn electrically connected by solder balls or electrically conductive adhesive to pads 75 disposed on the flex circuit 50, which is in thermal communication with cover plates 48 through thermally conductive vias within the flexible circuit. In the configuration drawn, heat from the semiconductor chips is conducted in two paths; through pads 75 to cover plates 48, and from the backside surfaces of chips 54" to the chamber walls of frame 12. However, it will be appreciated by one versed in the art of semiconductor packaging that flex circuit 50 may also be mechanically and thermally attached to the outer chamber walls of frame 12 of FIGS. 20, 22 and 23 such that the heat from chips 54" and pads 74 is instead conducted through the chamber walls and towards the interior portion of the interior cavity or hollow chamber 79 within frame 12. In this example (not shown) the backside surfaces of chips 54" would then be in direct thermal communication with cover plates 48. From the foregoing description, this is a preferred embodiment of FIG. 20.

It will also be apparent that the flexible circuit 50 may overlap and terminate with interior electrical connections onto the top ends of pads 22 (not shown) which are in turn disposed on the lower outside surfaces of frame 12 instead of flex circuit 50. In this example, pads 22, intended for electrical connection with fluidic socket 7' are integrated as part of frame 12 and may be embossed, thermally bonded or plated onto the lower exterior surfaces of the frame.

In the examples shown in FIGS. 20, 22 and 23, frame 12 is constructed as a separate and self-contained vessel with outer chamber walls and an interior cavity or hollow chamber 79 through which a cooling fluid is circulated. In these examples, a hermetic seal for containing circulating cooling fluids within the interior cavity or hollow chamber 79 is fashioned as an integral part of frame 12. Therefore, the interior cavities formed between cover plates 48 and the recessed chamber walls of frame 12 are not required to be hermetically sealed.

Flex circuit 50 is wrapped around the top-end of the frame in order to allow multiple ports 77 to be disposed along the bottom edge of the module. However, the flex circuit may also wrap around the bottom edge of the frame if the inlet and/or outlet ports are disposed in such a manner as to either clear the ends of the flex circuit or coincide with openings through the flex circuit itself as illustrated at the top edge of FIG. 21.

In other examples, as shown for instance in FIGS. 26C and 29, spacer 114 or central portion formed along axis B-B' by foldable frame 13 may likewise be engineered to contain a sealed interior cavity or hollow chamber intended for circulating a cooling fluid in a fashion similar to that described above.

Turning now to FIG. 22, another type of module frame 12 is illustrated which incorporates an internal heat pipe 86. In this example the thermally conductive coolant is contained within a sealed chamber that conducts and transports the heat of the semiconductor devices by a phase change of the enclosed coolant and subsequent wicking away of the heat to distal end(s) of the heat pipe that are immersed in either an impinging air stream or liquid spray coolant (e.g. water or solvent) or other coolant source.

In the future it is anticipated that some integrated circuit (IC) devices within the module may be potential sources for electromagnetic radiation or require protection against electrostatic discharge. Conversely, the contained IC devices may be sensitive to external sources for electromagnetic interference and require protection against the same. Or, in another embodiment, it may be desirable to provide a ground or voltage reference plane for improved signal integrity of the enclosed flex circuit 50 of the flex module. In these instances, is may be desirable to provide a ground or voltage connection to the outer cover plates 48 of flex module 10. Illustrated in FIG. 22 are two elevated contacts 6" of module socket 7' that are positioned to mate with and establish an electrical connection near the bottom edge of cover plates 48. An indentation 87 within the cover plate is intended to receive the uppermost portion of the elevated contacts 6" of socket 7'.

Turning now to FIG. 23, another embodiment of the flex-module is illustrated that incorporates a thermally conductive module frame 12, as previously described in FIGS. 20 and 22, in combination with a thin thermally conductive layer of carbon nano-tubes 88 arrayed in a linear fashion for the purpose of conducting heat from the semiconductor devices by rapid transport of liquids introduced through inlet ports 77 to outlet ports 81 previously described. The use of carbon nano-tubes (CNT) are intended to enable a reduction in fluid friction and consequent rapid fluid transport (e.g. water) through the linear array of CNTs to provide a more efficient means for removing heat from the interior portion of the flex module 10. The CNTs may be advantageously incorporated into a polymer or metal-alloy matrix that adheres to the walls of the interior cavities fashioned within frame 12 and which are orientated to transport the cooling fluid either longitudinally along the length of the module and/or cross-sectionally along the width of the module between inlet and outlet ports as previously described. In yet another embodiment of this design, the CNTs may be incorporated into the interior cavity 86 of a heat pipe similar to that shown in FIG. 22.

In yet another embodiment of the flex module, similar to FIG. 23, a thin film of special oxide material is applied to the interior and/or exterior surfaces of frame 12 and/or cover plates 48, or press molded into the shape of frame 12 and/or cover plates 48, which are then activated by an electric field to generate an electrocaloric (EC) effect that results in a reduction of temperature when the electric field is applied or withdrawn under adiabatic (without gain or loss of heat) conditions. Examples of preferred thin films for this EC effect include zirconium-rich piezoelectric ceramic material [Pb(Zr,Ti)$O_3$ or PZT]. It has been observed that the EC effect in zirconium-rich PZT is strongest near phase transitions and that various ways for optimizing EC effects include (a) nano-patterning single crystals to avoid the broad transitions seen in thin films, and (b) the use of an oxide such as $SrRuO_3$ to increase breakdown fields and reduce fatigue, and (c) aliovalent doping to improve fatigue properties. Partial substitution of tin for zirconium or strontium for lead will also lower the EC transition temperature toward room temperature. Development of ferroelectrics that contain bismuth rather than toxic lead may also be desirable along with anisotropic and low-angle grain boundaries to enhance thermal conductivity.

According to one aspect of the invention, a thin multichip module comprises a preformed frame; a flexible circuit applied to the preformed frame; and, a plurality of semiconductor devices mounted on the flexible circuit. The flexible circuit may further include an array of contacts and it may be applied to the preformed frame such that the array of contacts is aligned along one edge of the frame. The frame may further define an interior cavity whereby the semiconductor devices may be positioned within the cavity. The preformed frame and the array of contacts may be adapted for insertion into an edge-card connector, and more particularly may be adapted for insertion into a SIMM or DIMM socket. The flexible circuit may be applied to both major surfaces of the frame, particularly by folding the flexible circuit over one long dimension of the frame. The semiconductor devices may be mounted on the flexible circuit by in flip-chip style or by other conventional means, including through the use of anisotropic conductive adhesive.

According to another aspect of the invention, a thin multi-chip module comprises a foldable frame; a flexible circuit applied to the foldable frame; and, a plurality of semiconductor devices mounted on the flexible circuit. The flexible circuit may further include an array of contacts and it may be applied to the preformed frame such that the array of contacts is aligned along one edge of the frame. The frame may further define an interior cavity whereby the semiconductor devices may be positioned within the cavity. The preformed frame and the array of contacts may be adapted for insertion into an edge-card connector, and more particularly may be adapted for insertion into a SIMM or DIMM socket. The flexible circuit may be applied to both major surfaces of the frame, particularly by folding the flexible circuit over one long dimension of the frame. The semiconductor devices may be mounted on the flexible circuit by in flip-chip style or by other conventional means, including through the use of anisotropic conductive adhesive.

Foldable Module Assembly Process

The foldable frame resides in a flat configuration as shown in FIGS. 26A, 27A, 28E, 30C, for the flex circuit lamination process. The lamination process can be done using a thermally conductive adhesive that is sandwiched between the flex circuit and the foldable frame. The lamination process can be done in one step or in multiple steps whereby different sections of flex circuits are laminated at different times. Once the lamination process is done, the ICs are assembled using standard assembly processes including solder reflow followed by underfill and cure (as necessary). Alternatively, the chips may be assembled onto the flex circuit prior to the lamination or adhesive bonding of the flex circuit onto the foldable frame. Also, the modules can be assembled using conductive epoxy instead of solder. This is a low temperature alternative that may be beneficial in assembly of ICs (especially memory) that are thermally sensitive and that may be damaged through heat exposure. Once the module is built, it can be opened for rework operations such as replacing defective chips. Once the module is fully closed, cooling in the middle along the center line B-B' can be accomplished by virtue of the spacing left between the module sections. The hollow channel 120 can be obtained through the use of a central foldable 114 or non-foldable spacer 16. In this module-folding configuration, each chip is in a configuration that minimizes the path from the solder balls 106 to the heat sink, and each heat sink in foldable frame 13 is exposed to the cooling fluid. This is why the foldable module has maximum heat transfer and heat escapes from each chip equally well.

The present invention may further include various useful features to aid in actively cooling the circuit elements. For example, the inventive memory module may be modified to include a plurality of fluid inlets. The fluid inlets/outlets may be strategically placed to maximize heat removal from the operating semi-conducting chips. The cooling fluids channels are preferably designed to maximize thermal transfer between the chip and the cooling medium. These fluid channels are designed by choice of the specific configuration of chips (such as staggered chip configuration or hexagonal closed packed configuration) or by choice of a mechanism of fluid delivery. The cooling fluid may be air, various dry or inert gases such as argon or nitrogen, and various inert liquids The mechanism of fluid delivery has for a function to circumvent any impedance to the flow of the cooling media toward the target areas (in this case the plurality of semiconductor chips). The mechanism of fluid delivery may assume the shape of a bladder that is placed inside the module prior to closure. The bladder membrane is made of a flexible material and the walls of the bladder membrane are of such a thickness that the overall effect of the bladder is to conform to the internal topology of the internal space of the module. The bladder may have inlets and outlets for cooling fluid strategically placed to maximize cooling exposure to the semiconductor chips as well as to minimize the impedance of cooling fluid flow.

The mechanism of fluid delivery can assume the shape of rigid columnar structures that channel the fluid past the semiconductor areas of interest for the purpose of cooling in part or in full the chips that generate heat during operation.

The module may further contain spacers to prevent chip-to-chip contact during closure or mishandling. These spacers are placed inside the module in one or more locations to allow the module to close without accidental crushing or damage of the chips. It will be clear that structures may be disposed within the module that will serve both fluid control and spacer functions.

The electrical socket may contain provisions for cooling fluid delivery through a mechanism similar to an N-type connector, otherwise known as an Electro-fluidic socket, which enables the cooling fluid inlet from bottom of the module in case module is to operate under positive pressure cooling conditions and enables the cooling fluid outlet from bottom of the module in case module is cooled through negative pressure cooling conditions. The electrical and fluidic coupling of the module may therefore be done in one step operation when using an electro-fluidic socket—typically these couplings are executed in two different steps.

A fluidic conduit may be coupled to the socket to mate with the inlet/outlet of the cooling medium. Preferably, any fluid management structures will be designed to minimize added height or thickness to the module since these impact overall functionality of the system in its totality.

One preferable cooling fluid is air; air channels are obtained through mechanism of air delivery or through proper configuration of chips; there may be a single pair of inlet/outlet holes or there may be several pairs of them in order to optimize cooling. The inlet-air ports may be disposed at the top of the module, whereby air is pulled in through these ports by virtue of negative pressure applied from the bottom of the module.

Various liquid cooling fluids may also be used, such as water, glycols, inert fluorocarbon liquids, etc., as are well known in the art.

Alternatively, vapor phase cooling fluids may be employed as a means to control and maintain the temperatures of the semiconductor chips below a certain thermal damage threshold during operation. The thermal damage threshold is defined as excessive heat environment of the chip/substrate and their interconnect above which any one chip in the module, its interconnect and the substrate reach a failure mode that is instantaneous or latent, the shortening of the operational life of the chip module is considered under the latter case scenario.

Additional cooling may be provided to the outside metallic walls of the module. This cooling may be done in addition to any cooling taking place inside the module. It is preferred but not necessary that the cooling of the outside of the module is done in parallel to the inside of the module. The cooling of the outside of the module can be achieved using various methods that are known in the art, including the use of additional heat sink attachments to the outer metallic walls of the module in conjunction with forced fluidic cooling on the outer fins of the heat sink. Preferably any external heat sink structure will add only minimal thickness in order to obtain a low profile module that allows effective cooling between modules when they are in a stacked configuration or disposed closely together. One means of creating a low profile external heat sink is obtained through the use of corrugated structures that can be coupled to the electro-fluidic socket. Air can be the cooling fluid forced into the channels formed between the corrugated structure and the outer metallic wall of the module, and airflow can be forced by applying either positive or negative pressure for maximum design flexibility. One may also use special configurations of the corrugated structures to force the "Bemulli effect" to be created at selected localized spots (preferably directly opposite to the semi-conductor chips).

Although many of the examples described herein are directed to devices intended as a replacement for standard memory modules products, it will be appreciated that the inventive packaging technique may equally well be applied to numerous other familiar electronic devices and applications, especially for compact, portable, electronic products, where the benefits of significant size and weight reduction are particularly desirable.

The inventive Flex Modules can further be placed inside a container or housing. If the Flex DIMM is used inside a container then its design would change to be more suitable for its environment. It will be appreciated that the Flex memory modules may be placed parallel to each other within a container that has provision for fluid cooling such that the coolant circulates on the outside surfaces of the modules while the insides of the modules are also cooled by virtue of a fluid coolant coming from a different location. Alternatively, the fluid coolant may come from the same ports to supply the inside of the memory modules and also the outside of the memory modules.

The container encompassing the parallel arrangement of memory module can take various forms including but not limited to a box that has one or more inlets and one or more outlets. The mechanism of coolant fluid delivery for the outside surfaces of the parallel arrangement of memory modules can be a conformable bladder that hosts the fluid. This has the advantage that the fluid is contained at all times.

In the case of a box container, it will be appreciated that the metallic surfaces on the outside of the module have openings to allow for the fluid passage from the box container to the module. The openings can be strategically placed to allow the fluid to enter at the chip areas that are generating the most heat. The fluid can be made to circulate from the box container to the inside of the module through the openings by virtue of negative pressure applied from within the module itself.

Glossary of Terms for Figure Call-Outs:
A-A'—Center-fold axis of the frame or spacer
B-B'—Center-fold line of the flex
C-C'—Lateral-fold axis
D-D'—Lateral fold axis
12—Module frame (non-foldable)
13—Foldable frame
14, 14'—Depression, recessed cavity or window in Frame 12
16—Heat sinking spacer element (non-foldable)
22—Module contact pad
34, 34'—Socket contact pins
48—Heat exchanging external cover plates
50—Flex circuit (single fold)
51—Single, continuous strip of flex film (multi-fold flex)
54—IC device (non-stacked)
54"—IC device (stacked)
81—Elastomeric material
90—Coupling section/bridging circuit
92—Socket guide wall
94—Socket module latch
96—Socket motherboard latch
98—Motherboard PCB
100—Motherboard contact pad
102—Contact pad bump
104—passive device
105—left/right section I
106—Solder balls
107—left/right section E
108—Foldable area of the frame or spacer 109—Connector area
110—Bottom retainer
112—Pivot mechanism
114—Foldable spacer
116—Register chip
118—Phase Look Loop (PLL)
120—Hollow channel
122—End retainer
124—Snap latch
125—Foldable frame riser
126—Retaining bevel
128—Heat exchanging top retainer
130—Top retainer
132—Module connector or socket

We claim:

1. A low insertion force multichip in-line module comprising:
a substantially rigid frame;
a flex circuit having a plurality of integrated circuit chips disposed thereon, said flex circuit having contacts at least partially exposed along one edge of said frame; and,
a compliant layer disposed between said exposed flex circuit and said rigid frame, whereby controlled deformation of said compliant layer enhances electrical continuity between said contacts and corresponding external electrical pins.

2. The module of claim 1 wherein said contacts are arranged along the bottom edge of said module, said external pins are located below said contacts, and said controlled deformation is produced by a downward force applied to said module.

3. The module of claim 1 wherein said contacts are arranged along at least one lateral surface of said module, said external pins are located adjacent to said contacts, and said controlled deformation comprises a lateral deflection produced by a cam disposed within said compliant layer.

4. The module of claim 1 wherein said external pins are part of a socket assembly.

5. The module of claim 1 wherein said external pins comprise electrodes formed on the surface of a circuit board.

6. A low insertion force multichip in-line module comprising:
a substantially rigid frame;
a flex circuit having a plurality of integrated circuit chips disposed thereon, said flex circuit having contacts at least partially exposed along one edge of said frame;
a socket configured to matably engage said module; and,
a compliant layer disposed between said exposed flex circuit and said rigid frame, whereby controlled deformation of said compliant layer enhances electrical continuity between said contacts and corresponding external electrical pins.

7. The module of claim 6 wherein said contacts are arranged along the bottom edge of said module, said external pins are located below said contacts, and said controlled deformation is produced by a downward force applied to said module by a latch mechanism incorporated in said socket.

8. The module of claim 6 wherein said contacts are arranged along at least one lateral surface of said module, said external pins are located within said socket adjacent to said contacts, and said controlled deformation comprises a lateral deflection produced by a cam disposed within said compliant layer.

* * * * *